(12) United States Patent
Endres

(10) Patent No.: US 9,164,394 B2
(45) Date of Patent: Oct. 20, 2015

(54) ILLUMINATION OPTICAL SYSTEM AND OPTICAL SYSTEMS FOR MICROLITHOGRAPHY

(75) Inventor: Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 868 days.

(21) Appl. No.: 13/216,677

(22) Filed: Aug. 24, 2011

(65) Prior Publication Data

US 2011/0318696 A1    Dec. 29, 2011

Related U.S. Application Data

(63) Continuation of application No. PCT/EP2009/001622, filed on Mar. 6, 2009.

(51) Int. Cl.
*G03F 7/20* (2006.01)

(52) U.S. Cl.
CPC ............ *G03F 7/702* (2013.01); *G03F 7/70066* (2013.01); *G03F 7/70075* (2013.01); *G03F 7/70108* (2013.01); *G03F 7/70191* (2013.01)

(58) Field of Classification Search
CPC ............ G03F 7/70066; G03F 7/70075; G03F 7/70108; G03F 7/70191; G03F 7/702; G03F 7/70233; G03F 7/70083; G03F 7/708; G03F 7/70833; G02B 5/0891
USPC .......... 355/67, 77; 378/34; 359/350, 351, 849
See application file for complete search history.

(56) References Cited

U.S. PATENT DOCUMENTS

| 6,072,852 A | 6/2000 | Hudyma |
| 6,266,389 B1 | 7/2001 | Murayama et al. |

(Continued)

FOREIGN PATENT DOCUMENTS

| CN | 1445613 A | 10/2003 |
| CN | 101 263 430 A | 9/2008 |

(Continued)

OTHER PUBLICATIONS

Chinese Office Action, with translation thereof, for corresponding CN Appl No. 200980159125.6, dated Sep. 4, 2013.

(Continued)

*Primary Examiner* — Steven H Whitesell Gordon
(74) *Attorney, Agent, or Firm* — Fish & Richardson P.C.

(57) ABSTRACT

An imaging optical system for microlithography is used to illuminate an object field. The illumination optical system has a first transmission optical system for guiding illumination light proceeding from a light source. An illumination presetting facet mirror with a plurality of illumination presetting facets is arranged downstream of the first transmission optical system. The illumination presetting facet mirror produces a preset illumination of the object field via an edge shape, which can be illuminated, of the illumination presetting facet mirror and individual tilting angles of the illumination presetting facets. An arrangement of the first transmission optical system and the illumination presetting facet mirror is such that telecentric illumination of the object field results. An optical system according to a further aspect has, between the illumination presetting facet mirror and the object field, an entry pupil plane of a projection optical system, which, together with the illumination optical system, belongs to an optical system for microlithography. In this aspect, the first transmission optical system and the illumination presetting facet mirror are arranged to illuminate the object field adapted to the entry pupil of the projection optical system. In further aspects within an optical system with a projection optical system and an illumination optical system, a large object-image offset or a large intermediate focus-image offset is present in relation to an installation length of the projection optical system. Illumination optical systems and optical systems which satisfy particular efficiency demands with regard to the use of the illumination light result.

24 Claims, 13 Drawing Sheets

(56) References Cited

U.S. PATENT DOCUMENTS

| | | | |
|---|---|---|---|
| 6,361,176 B1 | 3/2002 | Mashima | |
| 6,396,067 B1 | 5/2002 | Braat | |
| 6,666,560 B2 | 12/2003 | Suzuki | |
| 6,704,095 B2 * | 3/2004 | Schultz | 355/67 |
| 6,770,894 B1 * | 8/2004 | Schultz | 250/492.2 |
| 6,859,328 B2 * | 2/2005 | Schultz et al. | 359/633 |
| 7,224,441 B2 | 5/2007 | Sasaki | |
| 7,858,957 B2 | 12/2010 | Warm et al. | 250/504 |
| 7,973,908 B2 * | 7/2011 | Mann | 355/53 |
| 8,629,972 B2 | 1/2014 | Zellner et al. | |
| 2002/0114089 A1 | 8/2002 | Dinger et al. | |
| 2002/0136351 A1 | 9/2002 | Singer | |
| 2003/0063375 A1 | 4/2003 | Suzuki et al. | |
| 2003/0076607 A1 * | 4/2003 | Antoni et al. | 359/858 |
| 2003/0095622 A1 | 5/2003 | Schultz et al. | |
| 2003/0227603 A1 | 12/2003 | Dierichs | |
| 2004/0065817 A1 | 4/2004 | Singer et al. | |
| 2004/0108467 A1 | 6/2004 | Eurlings et al. | |
| 2005/0002090 A1 * | 1/2005 | Singer et al. | 359/366 |
| 2005/0134980 A1 | 6/2005 | Mann et al. | |
| 2006/0132747 A1 * | 6/2006 | Singer et al. | 355/67 |
| 2006/0145094 A1 | 7/2006 | Wilhelmus et al. | |
| 2006/0146413 A1 * | 7/2006 | Klunder et al. | 359/634 |
| 2006/0162739 A1 * | 7/2006 | Sogard | 134/1 |
| 2007/0058269 A1 | 3/2007 | Mann et al. | |
| 2007/0195317 A1 | 8/2007 | Schottner et al. | |
| 2007/0223112 A1 * | 9/2007 | Mann et al. | 359/726 |
| 2007/0295919 A1 | 12/2007 | Endres et al. | |
| 2008/0123807 A1 * | 5/2008 | Warm et al. | 378/34 |
| 2008/0165415 A1 | 7/2008 | Chan et al. | |
| 2008/0246940 A1 | 10/2008 | Van Schoot et al. | |
| 2008/0259303 A1 | 10/2008 | Ossmann et al. | |
| 2008/0278704 A1 | 11/2008 | Endres et al. | |
| 2009/0251677 A1 | 10/2009 | Endres et al. | 355/71 |
| 2010/0134907 A1 | 6/2010 | Mann et al. | |
| 2011/0318696 A1 | 12/2011 | Endres | |
| 2014/0104588 A1 | 4/2014 | Zellner et al. | |

FOREIGN PATENT DOCUMENTS

| | | | |
|---|---|---|---|
| DE | 10 2006 043 2 | 3/2007 | |
| EP | 1202101 A2 | 5/2002 | |
| EP | 1 594 007 A2 | 11/2005 | |
| EP | 1 840 622 | 10/2007 | |
| JP | 2002-015979 | 1/2002 | |
| JP | 2002-203784 A | 7/2002 | |
| JP | 2003-045782 | 2/2003 | |
| JP | 2007-264636 | 10/2007 | |
| JP | 2008042203 | 2/2008 | |
| JP | 2008135743 | 6/2008 | B81C 99/00 |
| JP | 2008-158211 | 7/2008 | |
| JP | 2008-541439 A | 11/2008 | |
| JP | 2009-532724 | 9/2009 | |
| TW | 472176 B | 1/2002 | |
| WO | WO 2004010224 A2 * | 1/2004 | |
| WO | WO 2007/031271 | 3/2007 | |
| WO | WO 2007/115596 | 10/2007 | |
| WO | WO 2007115597 A1 * | 10/2007 | |
| WO | 2008/071305 | 6/2008 | G03F 7/20 |

OTHER PUBLICATIONS

Korean office action, with English translation thereof, for corresponding KR Appl No. 10-2011-7022784, dated Feb. 3, 2014.
Notice of Grounds for Rejection, Japanese Patent Application No. JP2001-552323, English Translation, 10 pages, Jun. 5, 2013.
Taiwanese office action, with English translation thereof, for TW Appl No. 99 106 422, dated Nov. 12, 2014.
Japanese office action, with English translation thereof, for JP application No. 2014-082141, dated Mar. 2, 2015.

* cited by examiner

ILLUMINATION OPTICAL SYSTEM AND OPTICAL SYSTEMS FOR MICROLITHOGRAPHY

CROSS-REFERENCE TO RELATED APPLICATION

This application is a continuation of, and claims priority under 35 USC 120 to, international application PCT/EP2009/001622, filed Mar. 6, 2009, which is hereby incorporated by reference in its entirety.

FIELD

The disclosure relates to an illumination optical system for microlithography. The disclosure further relates to optical systems for microlithography, a projection exposure installation with these optical systems, a method for producing a microstructured or nanostructured component and a microstructured component produced by the method.

BACKGROUND

An illumination optical system for microlithography is known from US 2006/0132747 A1. The concept of a specular reflector is described therein, in which the position of a facet mirror used to preset illumination is not (in contrast to some other known illumination optical systems) limited to an entry pupil plane a following projection optical system or a plane which is optically conjugated with the entry pupil plane of the following projection optical system.

SUMMARY

The present disclosure provides a specular reflector for illumination optical systems, of which particular efficiency demands are made with regard to the use of the illumination light.

In one aspect, the disclosure provides an illumination optical system for microlithography for illuminating an object field,
  with a first transmission optical system for guiding illumination light, proceeding from a light source,
  with an illumination presetting facet mirror downstream of the first transmission optical system with a plurality of illumination presetting facets, which produces a preset illumination of the object field via
    an edge shape which can be illuminated of the illumination presetting facet mirror and
    individual tilting angles of the illumination presetting facets, and
  with an arrangement of the first transmission optical system and the illumination presetting facet mirror in such a way that a telecentric illumination of the object field results.

It was firstly recognised according to the disclosure that the design degrees of freedom, which are produced by providing the illumination presetting facet mirror according to the disclosure, allow a telecentric illumination of the object field. A telecentric illumination of this type cannot be realised with a conventional illumination optical system with a field facet mirror and a pupil facet mirror arranged in the entry pupil plane of a following projection optical system, as, with a telecentric illumination of the object field, no entry pupil plane of the following projection optical system is defined. A conventional illumination optical system with a second fac-etted mirror in a conjugated pupil plane therefore has to have additional imaging optical elements and therefore has lower efficiency.

The telecentric illumination of the object field reduces demands made of a structure design on an object to be illuminated and imaged. In particular, a field-dependent imaging correction is dispensed with.

In contrast to a configuration of the illumination optical system which is an alternative to the specular reflector and basically known, with a field facet mirror and a pupil facet mirror arranged in a pupil plane or a plane of a projection optical system which is conjugated therewith, which is situated downstream of an illumination optical system of this type, the edge shape which can be illuminated of the illumination presetting facet mirror in the illumination optical system according to the disclosure represents a substantial influencing variable, on which the preset illumination of the object field depends. In the conventional illumination optical system with the field facet mirror and the pupil facet mirror, the edge shape, which can be illuminated, of the pupil facet mirror is not, in principle, decisive with regard to the intensity distribution of the illumination of the object field, as the edge shape of the pupil facet mirror in this case only influences the illumination angle distribution but not the shape of the object field which can be illuminated. On the other hand, in the illumination optical system according to the disclosure, the edge shape, which can be illuminated, of the illumination presetting facet mirror has a direct influence on the illuminated shape of the object field.

At most three reflective components may be arranged between a light source arrangement, which may include a collector for the emission of the light source, and the object field. In this case, in other words, only three or even only two reflective components are used between the light source arrangement and the object field. This reduces illumination light losses, in particular, when EUV light at a wavelength of, for example between 5 nm and 30 nm is used for illumination. Precisely two reflective components may be present between the light source arrangement and the object field.

A transmission facet mirror arranged upstream of the illumination presetting facet mirror, with a plurality of transmission facets, which are oriented in such a way that the illumination presetting facet mirror is illuminated with the preset edge shape adapted to the shape of the object field and a preset allocation to the illumination presetting facets again increases the design degrees of freedom when using the specular reflector principle. Using the transmission facet mirror, the illuminated edge shape of the illumination presetting facet mirror, an illumination angle distribution and an intensity distribution of the illumination presetting facet mirror can be precisely preset within the edge shape thereof which can be illuminated.

The transmission facets may be grouped in a plurality of transmission facet groups, one of the transmission facet groups in each case guiding illumination light for the complete illumination of the object field. A grouping of this type of transmission facets allows a defined superimposition of a plurality of facet groups completely illuminating the object field. These facet groups do not have to consist of spatially connected transmission facets. In the case of a complete overlap of the collector distant field by transmission facets it is advantageous to compose the facet groups of two or more complementary sub-groups, which complement one another to form a complete object field.

The transmission facet groups may have a group edge shape, which is geometrically similar to an edge shape of the object field. An edge shape similarity of this type increases the illumination quality of the object field.

The transmission facets, which build up a transmission facet group, may be arranged in a plurality of columns, a plurality of transmission facets being arranged consecutively in a column direction in each of the columns. A column arrangement of this type increases the number of individual transmission facets present within a transmission facet group. This ensures a very fine presetting, in particular of the angle distribution and the intensity distribution in the illumination of the illumination presetting facet mirror. The column direction extends here in particular parallel to an object displacement device, for which the illumination optical system within a projection exposure installation is designed.

Adjacent columns of the transmission facet mirror may have transmission facets arranged offset with respect to one another along the column direction. Transmission facets of this type arranged column-wise offset with respect to one another allow, in particular, a fine adaptation of a group edge shape to an object field edge shape. Curvatures of the group edge shape are then not limited by the dimensions of the individual transmission facets.

The transmission facets may be separated from one another by interstices, which extend at an angle, which is different from zero, with respect to the column direction. Transmission facets of this type extending obliquely with respect to the column direction and in particular obliquely with respect to an object displacement direction of an object to be illuminated by the illumination optical system prevent intensity artefacts of the object field illumination because of the facet division.

The illumination presetting facet mirror may have a through-opening, through which the illumination light is guided between the light source and the transmission facet mirror. A through-opening of this type allows very small angles of incidence to be realised on mirrors of the illumination optical system not operated with grazing incidence. This ensures small transmission losses, in particular when EUV light with a wavelength between 5 nm and 30 nm is used as the illumination light within a projection exposure installation equipped with the illumination optical system.

The illumination presetting facets, on the one hand, and the optionally additionally present transmission facets, on the other hand, may be configured as tiltable, in particular facets which can be tilted by an actuator. Tiltable facets of this type, may, in particular, be designed as facets which can be switched between at least two tilting positions. Small angles of incidence of the illumination light on the facets are important for a high efficiency, in particular, if the facets for adjusting different illumination modes are designed to be tiltable and because of the varying angles of incidence cannot be provided with a coating which is optimised for an angle.

The advantages of an optical system with an illumination optical system according to the disclosure and a projection optical system for imaging the object field in an image field correspond to those which were discussed above in connection with the illumination optical system according to the disclosure.

In another aspect, the disclosure provides an optical system
 with an illumination optical system for microlithography for illuminating an object field,
 with a first transmission optical system for guiding illumination light, proceeding from a light source,
 with an illumination presetting facet mirror arranged downstream of the first transmission optical system with a plurality of illumination presetting facets, which produces a preset illumination of the object field via
  an edge shape, which can be illuminated, of the illumination presetting facet mirror and
  tilting angles of the illumination presetting facets,
 with a projection optical system for imaging the object field in an image field, wherein
 an entry pupil plane of the projection optical system is arranged between the illumination presetting facet mirror and the object field or after the object field,
 wherein an arrangement of the first transmission optical system and the illumination presetting facet mirror is present in such a way that an illumination of the object field adapted to the entry pupil of the projection optical system results.

It was recognised that it is possible with the principle of the specular reflector to carry out an adaptation of the object field illumination to desired characteristics of the projection optical system on the entry side, with this not inevitably involving an optical component placed in the entry pupil plane of the projection optical system or this entry pupil plane to be displaced via a relay optical system to another location. An arrangement of the components of the illumination optical system guiding the illumination light, in which in particular very small angles of incidence of the illumination light can be realised on reflective optical components, is then possible even in projection optical systems with entry pupil planes, which are located closely in front of or behind the object field. Entry pupil planes of this type located close to the object field are to be found, for example, in pupil-obscured projection optical systems. Smaller reflection losses of the illumination light result.

A spacing ratio between a spacing of the entry pupil plane from the object field and a spacing of the object field from the illumination presetting facet mirror may be smaller than 0.9, smaller than 0.8, smaller than 0.7, smaller than 0.6 and may be smaller than 0.5. In a spacing ratio of this type, the advantages described above of such an optical system come to the fore particularly well. Independently of the spacing of the entry pupil plane from the object field, in the optical system according the disclosure, the spacing of the entry pupil plane from the illumination presetting facet mirror may be greater than 800 mm.

In a further aspect, the disclosure provides an optical system
 with an illumination optical system for microlithography for illuminating an object field,
 with a first transmission optical system for guiding illumination light, proceeding from a light source,
 with an illumination presetting facet mirror arranged downstream of the first transmission optical system with a plurality of illumination presetting facets, which produces a preset illumination of the object field via
  an edge shape, which can be illuminated, of the illumination presetting facet mirror and
  tilting angles of the illumination presetting facets,
 with a projection optical system for imaging the object field in an image field, wherein a ratio of an installation length (B) of the projection optical system and an object-image offset ($d_{OIS}$) is less than 20.

The degrees of freedom of the principle of the specular reflector may be advantageously combined with a projection optical system with a large object-image offset such that the illumination light can also be guided past desired large installation space properties on the image side without additional optical components guiding illumination light being used for this and without extreme angles of incidence reducing the throughput having to be selected. This ratio of the installation length of the projection optical system and the object-image offset may be less than 15 and may be less than 10.

In an additional aspect, the disclosure provides an optical system with an illumination optical system for microlithography for illuminating an object field
with a first transmission optical system for guiding illumination light, proceeding from a light source,
with an illumination presetting facet mirror arranged downstream of the first transmission optical system with a plurality of illumination presetting facets, which produces a preset illumination of the object field via
an edge shape which can be illuminated of the illumination presetting facet mirror and
tilting angles of the illumination presetting facets,
with a projection optical system for imaging the object field in an image field,
wherein the illumination optical system between the light source and the object field has an intermediate focus,
wherein a ratio of an installation length (B) of the projection optical system and an intermediate focus-image offset (D) is less than 5.

With a ratio of this type of the installation length of the projection optical system and the intermediate focus-image offset, it can also be ensured that the illumination light can be guided past desired large installation space properties on the image side without additional optical components guiding illumination light being used for this and without extreme angles of incidence reducing the throughput having to be selected. The ratio of the installation length of the projection optical system and the intermediate focus-image offset may be less than 3, be less than 2, be less than 1.90, be less than 1.80, be less than 1.60 and may, in particular, be less than 1.31.

A typical desired installation space property on the image side, measured in an image plane from the centre of the image field, is about 1 m, in particular also in the direction of components of the illumination optical system, and moreover also about 1 m, measured perpendicular to the image plane away from the projection optical system.

In another aspect, the disclosure provides an optical system with an illumination optical system for microlithography for illuminating an object field,
with a first transmission optical system for guiding illumination light, proceeding from a light source,
with a projection optical system for imaging the object field in an image field characterised in that a ratio of an installation length (B) of the projection optical system and an illumination light beam-image offset (E) is less than 5.

The advantages of such an optical system correspond to those which described in conjunction with the optical system described three paragraphs above. In the optical system noted in the preceding paragraph, an intermediate focus of the illumination optical system does not inevitably have to be present. An illumination presetting of the object field may be designed differently than by the illumination presetting facet mirror of the optical system described three paragraphs above. The ratio of the installation length of the projection optical system and the illumination light beam-image offset may be less than 3, be less than 2, be less than 1.90, be less than 1.80, be less than 1.60 and may, in particular, be in the region of 1.30.

Features of the optical systems described herein may be combined with features of an illumination optical system described herein, in particular with the features relating to the transmission facet mirror.

Advantages of a projection exposure installation with an optical system according to the disclosure and a light source, in particular an EUV light source, a production method for producing a microstructured component, and a microstructured or nanostructured produced by such a method, correspond to the advantages noted above with respect to illumination optical systems according to the disclosure and the optical systems according to the disclosure.

The disclosure provides a production method for producing a component with the method steps:
providing a reticle,
providing a wafer with a coating which is sensitive to the illumination light,
projecting at least a portion of the reticle onto the wafer with the aid of the projection exposure installation according to the disclosure, and
developing the light-sensitive layer exposed with the illumination light on the wafer.

BRIEF DESCRIPTION OF THE DRAWINGS

Configurations of the disclosure will be described in more detail below with the aid of the drawings, in which.

DETAILED DESCRIPTION

Figure 1:
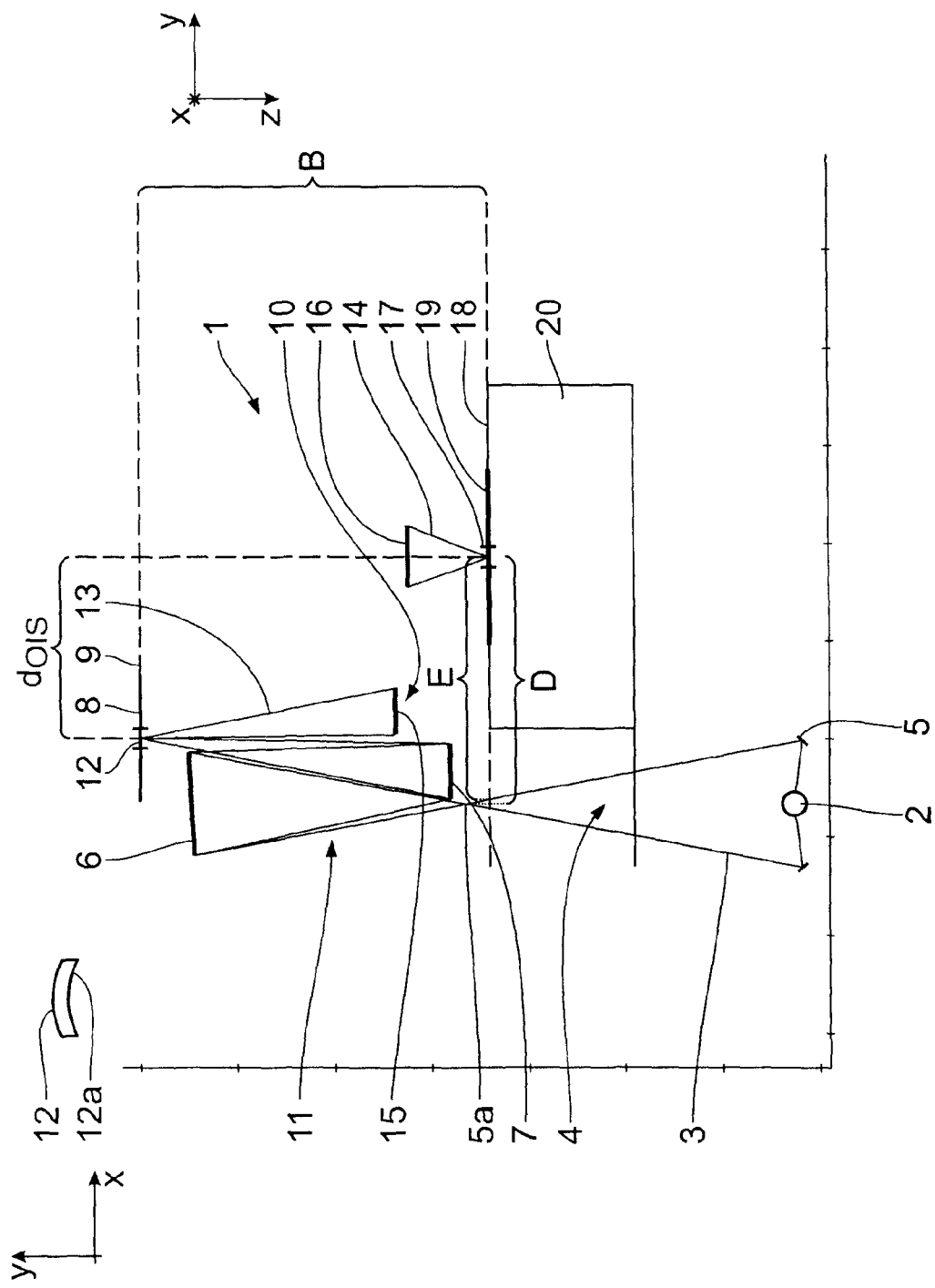
FIG. 1 shows, highly schematically in a meridional section, a projection exposure installation for EUV microlithography with an illumination optical system and a projection optical system.

A projection exposure installation 1 for microlithography shown in meridional section and highly schematically in FIG.

1 has a light source 2 for illumination light 3. The light source is an EUV light source, which produces light in a wavelength range of between 5 nm and 30 nm. This may be an LPP (Laser Produced Plasma) light source or a DPP (Discharged Produced Plasma) light source.

A transmission optical system 4 is used to guide the illuminate light 3, proceeding from the light source 2. This has a collector 5, shown only with regard to its reflective effect in FIG. 1, and a transmission facet mirror 6 described in more detail below. An intermediate focus 5a of the illumination light 3 is arranged between the collector 5 and the transmission facet mirror 6. A numerical aperture of the illumination light 3 in the region of the intermediate focus 5a is NA=0.182. Arranged downstream of the transmission facet mirror 6 and therefore the transmission optical system 4 is an illumination presetting facet mirror 7, which will also be described in more detail below. Arranged downstream of the illumination presetting facet mirror 7 in the beam path of the illumination light 3 is a reticle 8, which is arranged in an object plane 9 of a downstream projection optical system 10 of the projection exposure installation 1. The projection optical system 10 and the projection optical systems described below of the further configurations are in each case a projection lens system.

To facilitate the view of position relationships, a Cartesian xyz-coordinate system will be used below. The x-direction, in FIG. 1, runs perpendicular to the plane of the drawing and into it. The y-direction extends, in FIG. 1, to the right. The z-direction extends downward in FIG. 1.

The optical components 5 to 7 are components of an illumination optical system 11 of the projection exposure installation 1. An object field 12 on the reticle 8 in the object plane 9 is illuminated in a defined manner by the illumination optical system 11. The object field 12 has an arcuate or part circle shape and is limited by two arcs that are parallel to another and two straight side edges, which extend in the y-direction with a length $y_0$ and have a spacing $x_0$ from one another in the x-direction. The aspect ratio $x_0/y_0$ is 13 to 1. An insert of FIG. 1 shows a plan view, not to scale, of the object field 12. An edge shape 12a is arcuate. In an alternative and also possible object field 12, the edge shape thereof is rectangular.

The projection optical system 10 is only partially and highly schematically indicated in FIG. 1. A numerical aperture 13 on the object field side and a numerical aperture 14 on the image field side of the projection optical system 10 are shown. Located between indicated optical components 15, 16 of the projection optical system 10, which may be configured, for example, as mirrors which are reflective to the EUV illumination light 3, are further optical components of the projection optical system 10 for guiding the illumination light 3 between these optical components 15, 16.

The projection optical system 10 images the object field 12 in the image field 17 in an image plane 18 on a wafer 19, which, like the reticle 8, is carried by a holder, not shown in more detail. An installation space property of the wafer holder is shown as a rectangular box in FIG. 1 at 20. The installation space property 20 is rectangular with an extent in the x-, y- and z-direction which depends on the components to be accommodated therein. The installation space property 20, for example, proceeding from the centre of the image field 17, in the x-direction and in the y-direction, has an extent of 1 m. In the z-direction, the installation space property 20, proceeding from the image plane 18, also has an extent of, for example, 1 m. The illumination light 3 in the illumination optical system 11 and the projection optical system 10 has to be guided in such a way that it is in each case guided past the installation space property 20.

The transmission facet mirror 6 has a plurality of transmission facets 21. Of these transmission facets 21, in the meridional section according to FIG. 2, a line with a total of nine transmission facets 21 is shown schematically, these being indicated in FIG. 2, from left to right, by $21_1$ to $21_9$. In fact the transmission facet mirror has a substantially larger plurality of transmission facets 21 which will become clearer from FIGS. 3 and 4. The transmission facets 21 are grouped in a plurality of transmission facet groups 22. One of these transmission facet groups 22 is emphasised at the edge in FIG. 4 for better recognisability.

An x/y-aspect ratio of the transmission facet groups 22 is at least as large as the x/y-aspect ratio of the object field 12. In the configuration shown, the x/y aspect ratio of the transmission facet groups 22 is larger than the x/y-aspect ratio of the object field 12. The transmission facet groups 22 have a part circular curved group edge shape, which is similar to the edge shape of the object field 12.

Each of the transmission facet groups 22 is arranged from 16 columns arranged offset with respect to one another in the x-direction each with seven lines of transmission facets 21 arranged next to one another in the y-direction. Each of the transmission facets 21 is rectangular. The x/y-aspect ratio of the transmission facets 21 is shown, in particular in FIG. 4, in the x-direction, on the one hand, and in the y-direction, on the other hand, not to the same scale. In practice, an x/y-aspect ratio of 1/1 can be selected for the transmission facets 21.

Each of the transmission facet groups 22 leads to a proportion of the illumination light 3 for respective complete illumination of the object field 12.

Figure 3:
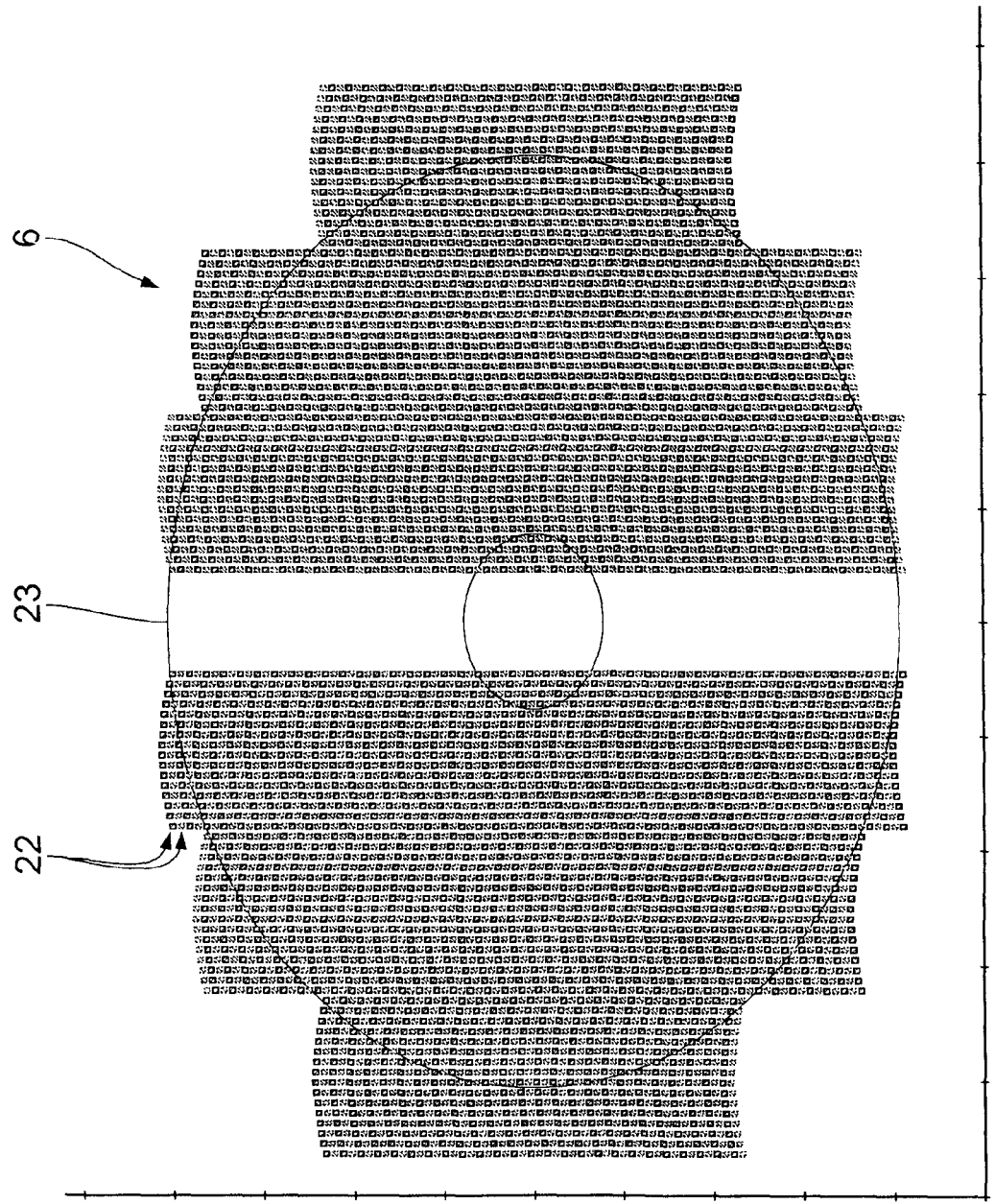
FIG. 3 shows a transmission facet mirror of the illumination optical system in a view which allows a distribution of transmission facets of the transmission facet mirror to be sees.

As can be inferred from FIG. 3, a total of six group columns are present with, in each case, a plurality of tens of the facet groups 22. This column-wise arrangement of the facet groups 22 is such that, as a result, an illumination light beam 23 indicated schematically in FIG. 3 by an annular distance field is practically completely recorded.

Figure 4:
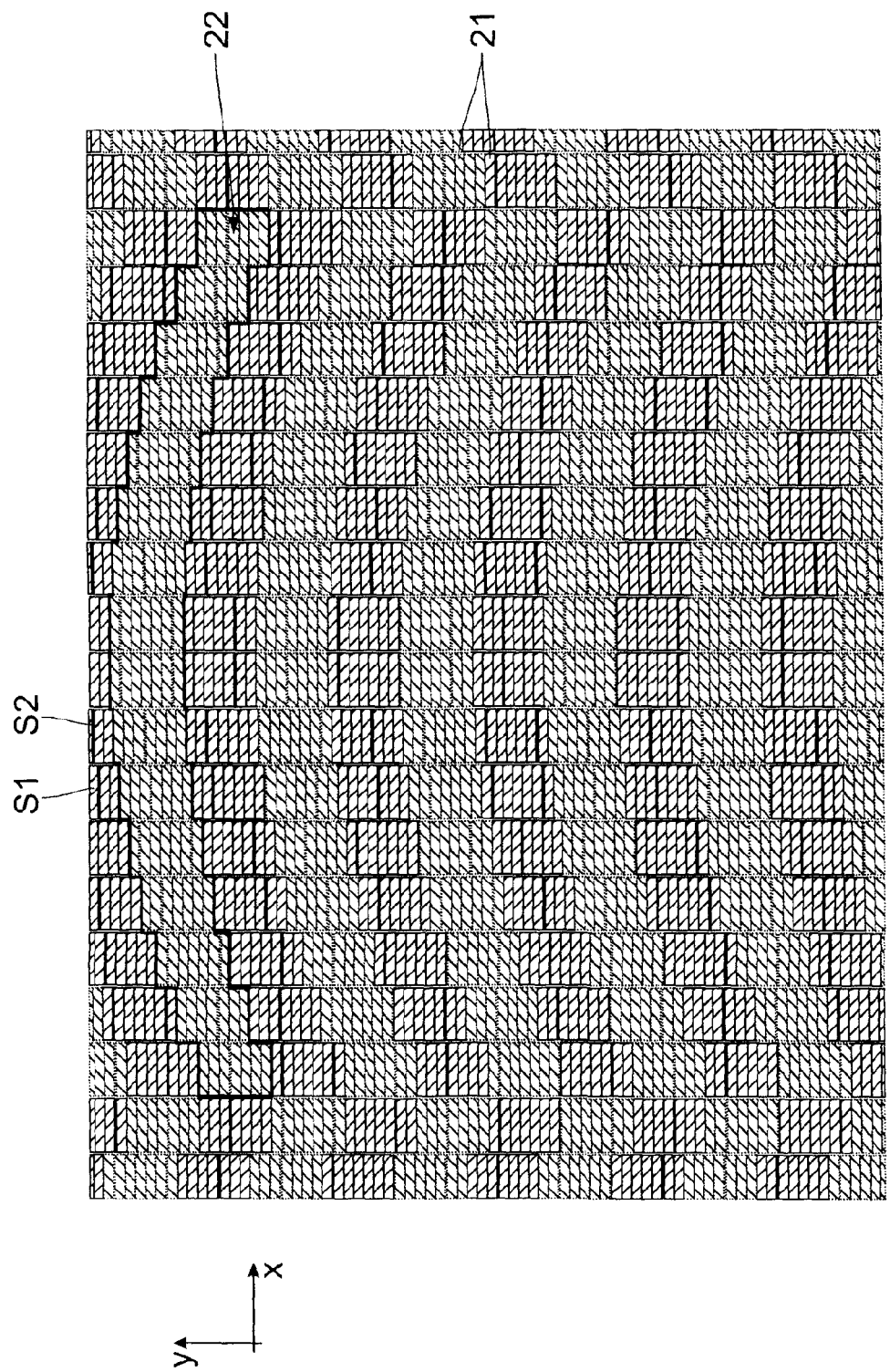
FIG. 4 shows detailed enlargement from FIG. 3 in the region of several transmission facet groups, of which each illumination light leads to the complete illumination of an object field in the object plane of the projection optical system.

As can be inferred from FIG. 4, these transmission facets 21 are arranged offset with respect to one another in the y-direction in selected adjacent columns of the transmission facets 21. This is illustrated in FIG. 4 with the aid of two columns S1 and S2. Transmission facets 21, which are present adjacent to one another in these two columns S1, S2, of a transmission facet group 22 are in each case arranged offset with respect to one another in the y-direction about half the y-extent of the transmission facets 21. In the case of other adjacent columns (cf for example the columns S3 and S4 in FIG. 4) transmission facets 21 which are present adjacent to one another in these columns, of a transmission facet group 22 are in each case arranged offset with respect to one another in the y-direction about a complete y-extent of the transmission facets 21. Because of this offset, despite a handleable size in terms of dimension of the y-extent of the individual transmission facets 21, a preset large radius of curvature of the transmission facet groups 22 can be realised.

The transmission facets 21 are oriented such that the illumination presetting facet mirror 7 is illuminated with a preset edge shape 24 (cf FIG. 5) and a preset allocation of the transmission facets 21 to illumination presetting facets 25 of the illumination presetting facet mirror 7.

Figure 2:
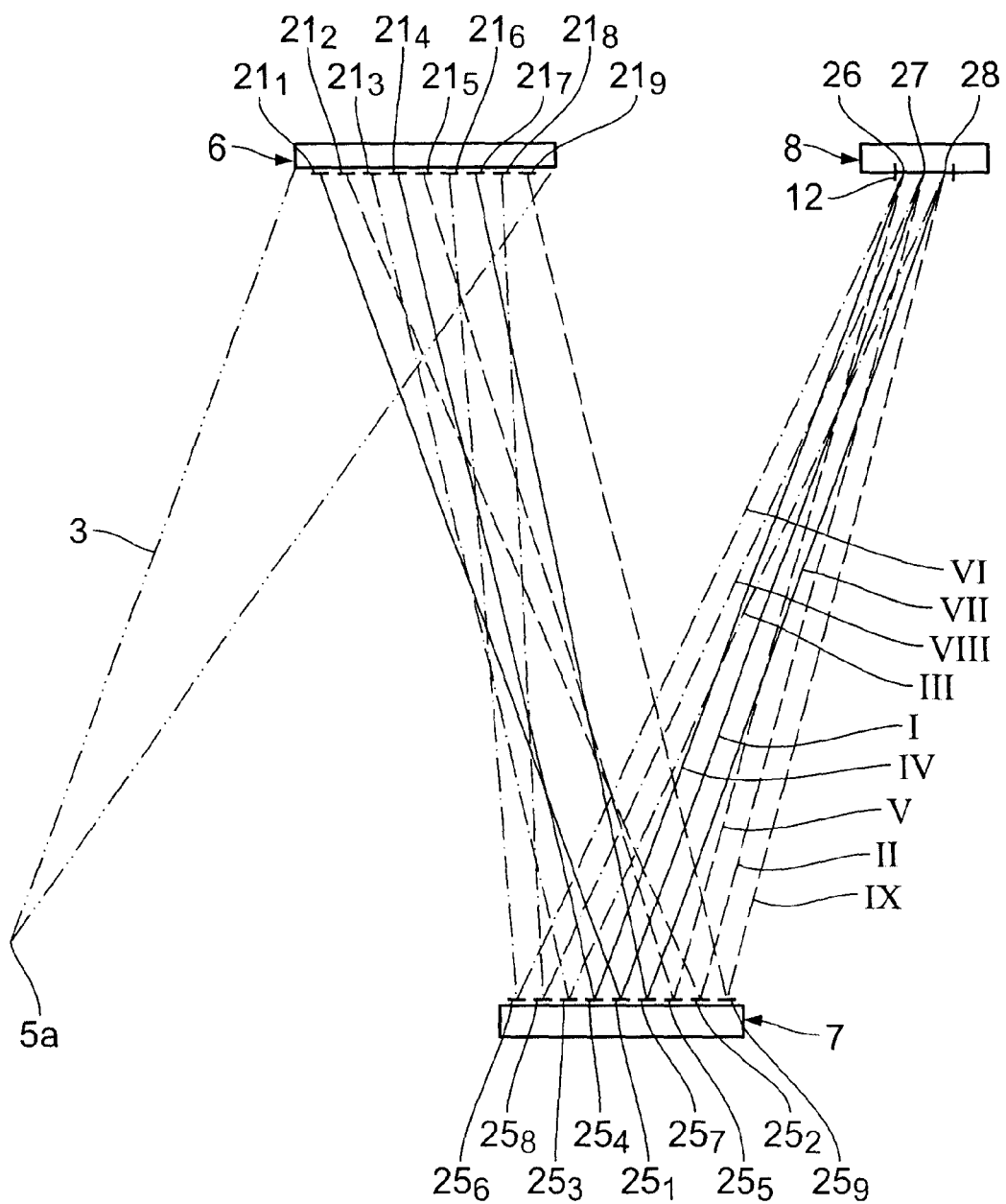
FIG. 2 shows schematically and also in meridional section, a beam path of selected individual beams within the illumination optical system according to FIG. 1, proceeding from an intermediate focus through to a reticle arranged in the object plane of the projection optical system.

An example of the preset allocation of the transmission facets 21 with respect to the illumination presetting facets 25 is shown in FIG. 2. The illumination presetting facets 25 allocated in each case to the transmission facets $21_1$ to $21_9$ are indicated in accordance with this allocation. The illumination facets 25 are illuminated from left to right because of this allocation in the order $25_6$, $25_8$, $25_3$, $25_4$, $25_1$, $25_7$, $25_5$, $25_2$ and $25_9$.

The indices 6, 8 and 3 of the facets 21, 25 include three illumination channels VI, VIII and III, which illuminate three object field points 26, 27, 28, which are numbered from left to right in FIG. 2, from a first illumination direction. The indices 4, 1 and 7 of the facets 21, 25 belong to three further illumination channels IV, I, VII, which illuminate the three object field points 26 to 28 from a second illumination direction. The indices 5, 2 and 9 of the facets 21, 25 belong to three further illumination channels V, II, IX, which illuminate the three object field points 26 to 28 from a third illumination direction.

The illumination directions, which are allocated to
the illumination channels VI, VIII, III,
the illumination channels IV, I, VII and
the illumination channels V, II, IX
are identical in each case. The allocation of the transmission facets 21 to the illumination presetting facets 25 is therefore such that a telecentric illumination of the object field results.

The illumination of the object field 12 via the transmission facet mirror 6 and the illumination presetting facet mirror 7 takes place in the manner of a specular reflector. The principle of the specular reflector is known from US 2006/0132747 A1.

The projection optical system 10 has an object-image offset $d_{OIS}$ of 930 mm. This is defined as the spacing of a centre point of the object field 12 from a piercing point of a normal on the centre point of the image field 7 through the object plane 9. The projection exposure installation 1 with the projection optical system 10 has an intermediate focus-image offset D of 1280 mm. The intermediate focus-image offset D is defined as the spacing of the centre point of the image field 17 from a piercing point of a normal from the intermediate focus 5a on the image plane 18. The projection exposure installation 1 with the projection optical system 10 has an illumination light beam-image offset E of 1250 mm. The illumination light beam-image offset E is defined as the spacing of the centre point of the image field 17 from a piercing region of the illumination light beam 3 through the image plane 18.

Because of the large object-image offset $d_{OIS}$, on the one hand, and because of the large intermediate focus-image offset D or because of the large illumination light beam-image offset E, a guidance of the illumination light 3 that runs practically parallel to the z-direction between the light source 2 and the transmission facet mirror 6 past the installation space 20 is possible. This illumination light guidance ensures small angles of incidence of the illumination light 3 at the facet mirrors 6 and 7. The average angle of incidence at the transmission facet mirror 6 is 3.5°. An average angle of incidence at the illumination presetting facet mirror 7 is 6.5°.

The angle of incidence is defined as half the angle between a main beam of the illumination light 3 before and after the respective reflection. The main beam is, in this case, the beam of the illumination light 3 which connects the centres of the reflection faces used of the facet mirrors 6, 7 to one another. Because of the small angles of incidence, a correspondingly high reflection efficiency of the facet mirrors 6, 7 results.

Figure 5:
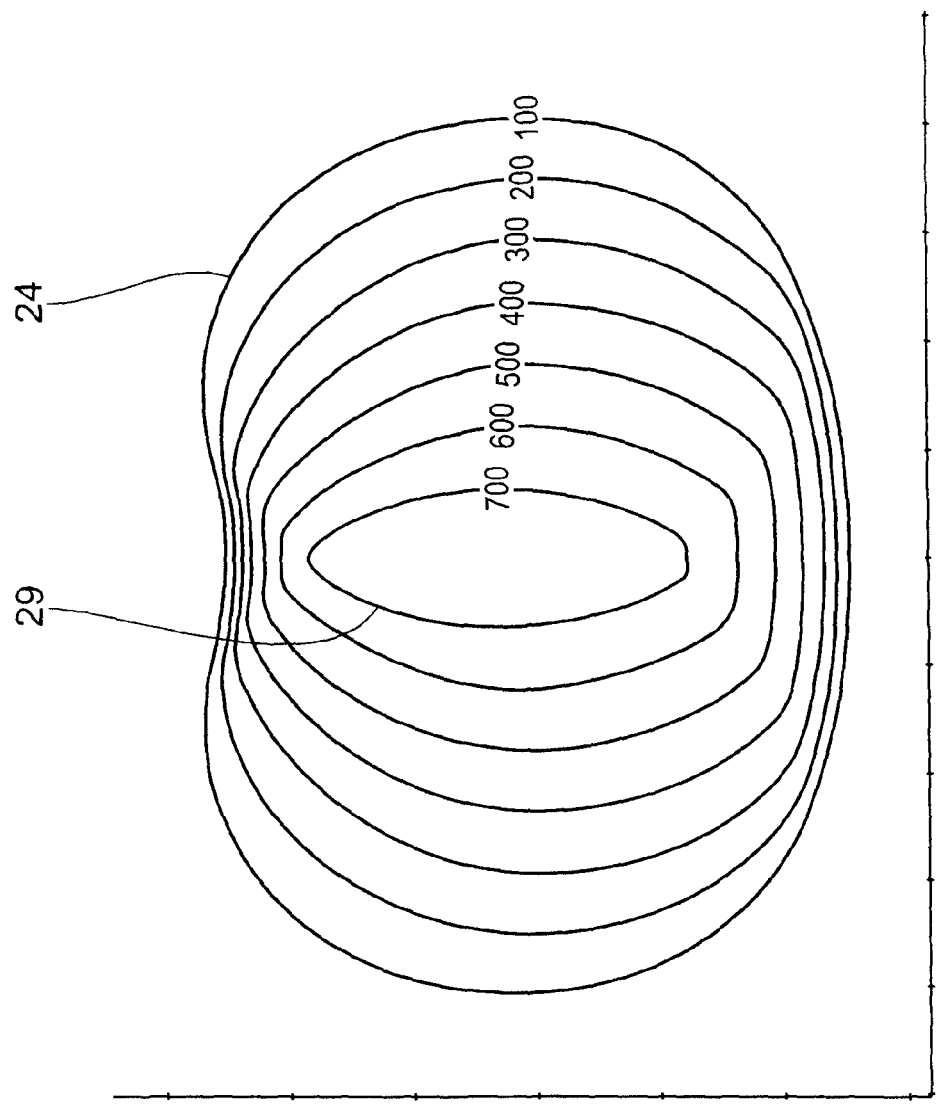
FIG. 5 shows a contour view of an intensity distribution of the illumination light on an illumination presetting facet mirror of the illumination optical system arranged downstream of the transmission facets.

Apart from the edge shape 24 of the illumination of the illumination presetting facet mirror 7, FIG. 5 also illustrates an intensity distribution of the illumination of the illumination presetting facet mirror 7 within the edge shape 24. This intensity distribution is indicated in FIG. 5 by a contour view. The outermost contour reflecting the edge shape 24 corresponds to an illumination intensity of "100" in random units. The respective adjacent contours toward the inside indicate those locations with the same intensity loading, in which the intensity is present in the same units increased by the value 100 in each case. The innermost illumination shape 29, which has approximately the shape of an American football, corresponds to an illumination intensity with a value 700. The edge shape 24 in total has the shape of a bean or kidney opening at the top, as already explained in principle in conjunction with the illumination of the specular reflector in US 2006/0132747 A1.

The edge shape 24 is dependent on the desired illumination angle distribution over the object field 12 and dependent on the desired intensity distribution over the object field 12. The edge form 24 will be variable over the illumination presetting facet 25 of the illumination presetting facet mirror 7, in other words dependent on a respective preset value.

The transmission facets 21, on the one hand, and the illumination presetting facets 25, on the other hand, may be tiltable via an actuator, so both the illumination angle distribution and the intensity distribution of the illumination light 3 over the object field 12 can be preset.

The part circle shape of the object field 12, which is illuminated by the illumination presetting facet mirror 7 with this edge shape 24, also correspondingly opens upwardly. The preset illumination of the object field 12 is thus brought about via the specular reflector arrangement with the facet mirrors 6, 7, on the one hand, by the edge shape 24 which can be illuminated of the illumination presetting facet mirror 7 and, on the other hand, via the individual tilting angles of the illumination presetting facets 25.

Figure 6:
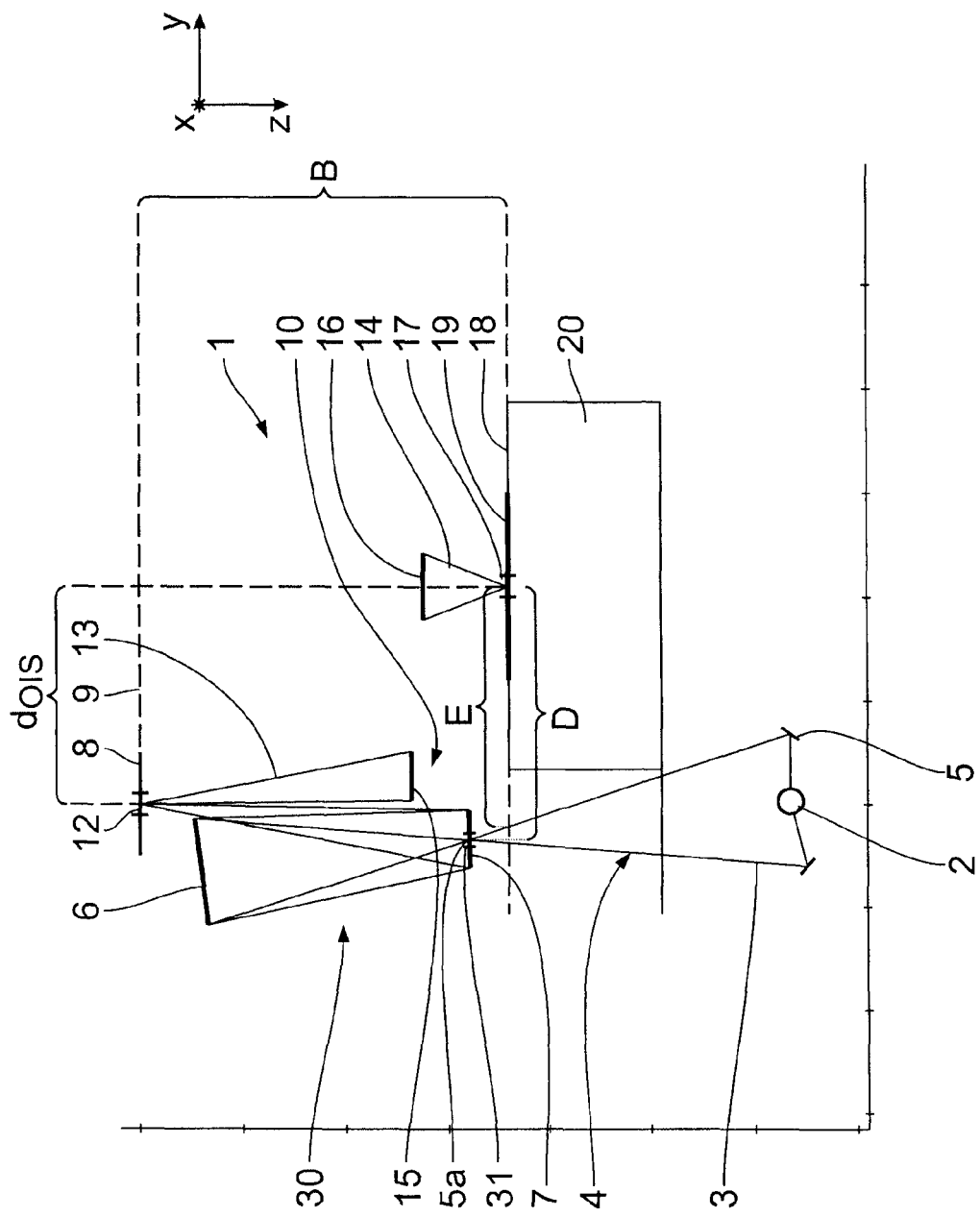
FIG. 6 shows, in a view similar to FIG. 1, a further configuration of an EUV projection exposure installation.

FIG. 6 shows a further configuration of a projection exposure installation 1 with an illumination optical system 30, which can be used instead of the illumination optical system 11 to illuminate the object field 12. Components which correspond to those which have already been described above with reference to FIGS. 1 to 5, have the same reference numerals and are not discussed again in detail.

In the illumination optical system 30, the illumination presetting facet mirror 7 is provided with a central through-opening 31. The illumination light 3 is guided through the through-opening 31 between the light source 2 and the transmission facet mirror 6. The transmission facets 21, not shown in detail in FIG. 6, of the transmission facet mirror 6 are oriented such that the illumination light 3 after the transmission facets 21 impinges upon the illumination presetting facets 25 of the illumination presetting facet mirror 7 arranged around the through-opening 31. The illumination of the illumination presetting facet mirror 7 and the tilting angles of the illumination facets 25 are in turn such that the object field 12, as described above in conjunction with FIG. 2, is telecentrically illuminated.

This configuration of the illumination presetting facet mirror 7 with the through-opening 31 is also called an obscured configuration.

Because of the obscured design of the illumination presetting facet mirror 7, the illumination optical system 30 can be realised with even smaller average angles of incidence on the facet mirrors 6, 7 in comparison to the illumination optical system 11. The average angle of incidence on the transmission facet mirror 6 is 0°. The average angle of incidence on the illumination presetting facet mirror 7 of the illumination optical system 30 is 6.5°.

A numerical aperture of the illumination light 3 in the region of the intermediate focus 5a is NA=0.193.

The projection exposure installation 1 with the illumination optical system 30 and the projection optical system 10 has an intermediate focus-image offset D of 1070 mm. The projection exposure installation 1 with the illumination optical system 30 and the projection optical system 10 has an illumination light beam-image offset E of 1030 mm.

With the aid of FIG. 7, a further configuration of a projection exposure installation 1 with an illumination optical system 32, which can be used instead of the illumination optical system 11 or 30 to illuminate the object field 12, will be described below. Components, which correspond to those which have already been described above with reference to FIGS. 1 to 6, have the same reference numerals and will not be discussed again in detail.

Figure 7:
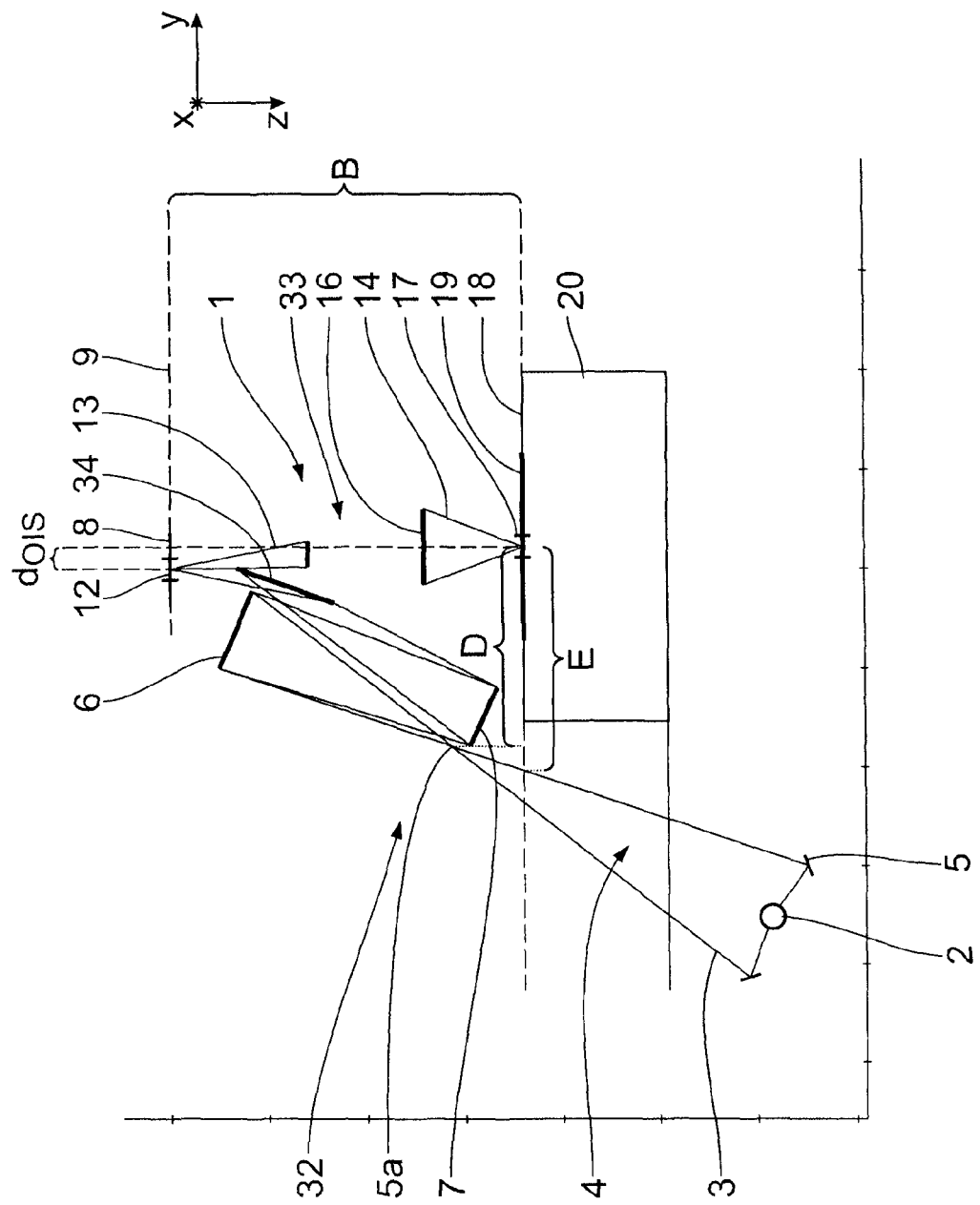
FIG. 7 shows in a view similar to FIG. 1, a further configuration of an EUV projection exposure installation.

Instead of the projection optical system 10 of the configuration according to FIG. 1, the projection exposure installation 1 according to FIG. 7 has a projection optical system 33.

The illumination optical system 32, apart from the transmission facet mirror 6 and the illumination presetting facet mirror 7, also has a mirror 34 used to deflect the illumination light 3 between the illumination presetting facet mirror 7 and the object field 12 for grazing incidence.

The projection optical system 33, at 90 mm, has a very much smaller object-image offset $d_{OIS}$ in comparison to the projection optical system 10.

The object field 12 is also telecentrically illuminated with the illumination optical system 32 in the configuration according to FIG. 7. This is achieved by a corresponding orientation and illumination of the facet mirrors 6, 7.

A numerical aperture of the illumination light 3 in the region of the intermediate focus 5a is NA=0.167.

The projection exposure installation 1 with the illumination optical system 32 and the projection optical system 33 has an intermediate focus-image offset D of 930 mm. The projection exposure installation 1 with the illumination optical system 32 and the projection optical system 33 has an illumination light beam-image offset E of 1070 mm.

With the aid of FIG. 8, a further configuration of a projection exposure installation 1 with an illumination optical system 35, which can be used instead of the illumination optical system 32 according to FIG. 7 to illuminate the object field 12, and with a projection optical system 36, which can be used instead of the projection optical system 33 according to FIG. 7, will be described. Components, which correspond to those which have already been described above with reference to FIGS. 1 to 7, have the same reference numerals and will not be discussed again in detail.

The projection optical system 36 has an entry pupil 37, which is located in the beam path of the illumination light 3 in front of the object field 12.

The facets 21, 25 of the two facet mirrors 6, 7 are arranged with respect to one another in the illumination optical system 35 in such a way that an illumination of the object field 12 which is adapted to this position of the entry pupil 37 of the projection optical system 36 results. In this entry pupil 37, a cross sectional shape and a divergence of the illumination light beam 3 correspond to an imaging light beam which can be guided on the entry side in the projection optical system 36.

Figure 8:
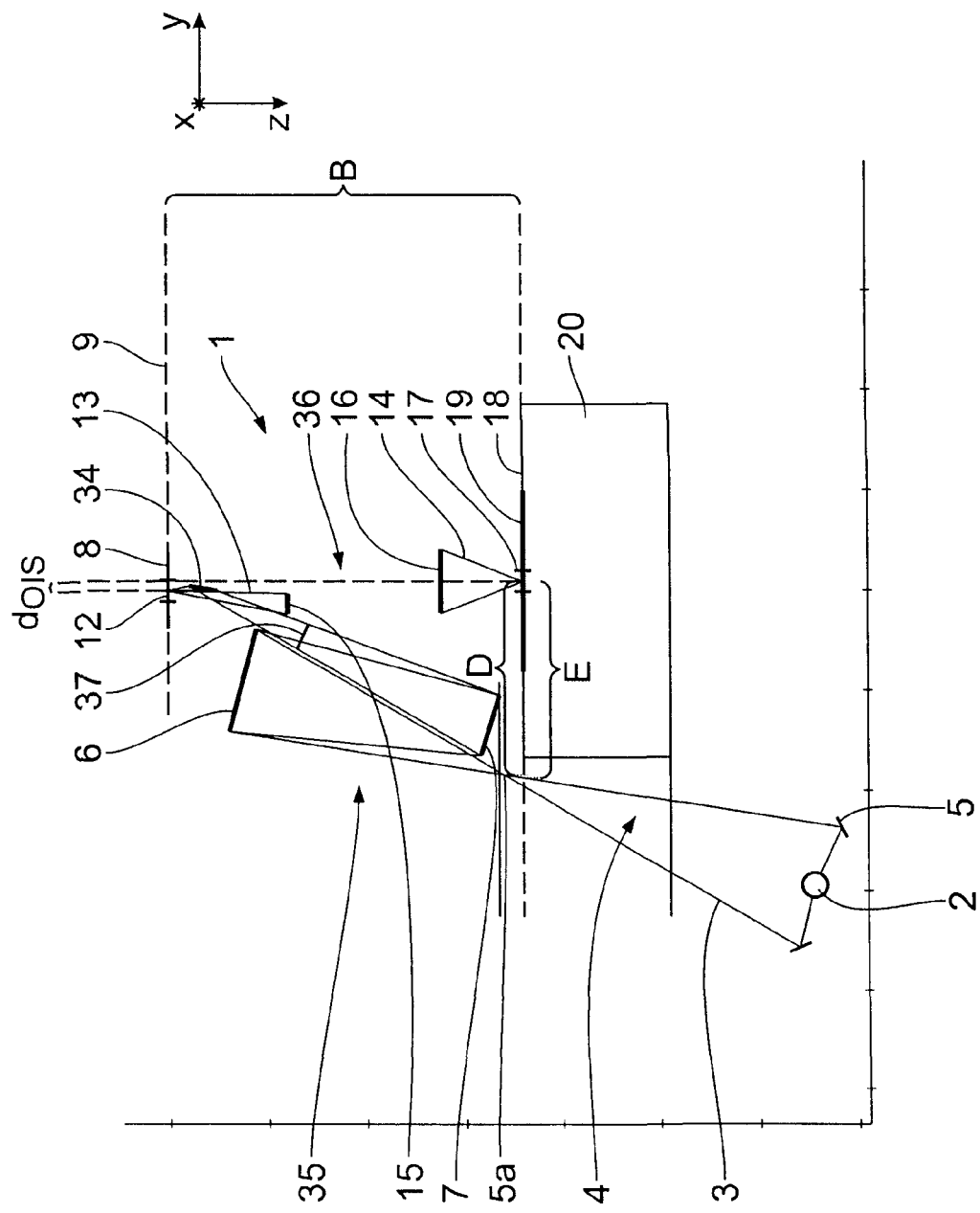
FIG. 8 shows in a view similar to FIG. 1, a further configuration of an EUV projection exposure installation.

The entry pupil 37 lies between the illumination presetting facet mirror 7 and the mirror 34 for grazing incidence of the illumination optical system 35 according to FIG. 8. A ratio of a spacing of the entry pupil 37 from the object field 12 and a spacing of the illumination presetting facet mirror 7 from the object field 12 in the configuration according to FIG. 8 is about 0.38, in other words is smaller than 0.50. Depending on the configuration of the illumination optical system 35, this ratio is basically smaller than 1, for example smaller than 0.9, smaller than 0.8, smaller than 0.7 or smaller than 0.6. The spacing between the entry pupil 37 and the illumination presetting facet mirror 7 in the configuration according to FIG. 8 is greater than 500 mm and may, in particular, be greater than 800 mm.

An entry pupil 37 of this type arranged close to the object field 12 is present, for example, if the projection optical system 36 is designed with a central pupil obscuration. Examples of projection optical systems of this type are to be found in the prior art cited in EP 1 950 594 A1. Because of the configuration of the illumination optical system 35 with the specular reflector formed by the facet mirrors 6, 7, the illumination presetting facet mirror 7 may thus be arranged further removed from the object field 12 than the entry pupil 37. This leads to small angles of incidence on the facet mirrors 6, 7. An average angle of incidence of 4.7° is present on the transmission fact mirror 6. An average angle of incidence of 7.5° is present on the illumination presetting facet mirror 7. The mirror 34 for grazing incidence, despite these small average angles of incidence on the facet mirrors 6, 7, allows a main direction of incidence of the illumination light 3 from the collector 5 via the intermediate focus 5a toward the transmission facet mirror 6, which deviates significantly from the vertical. This ensures that the illumination light 3 is guided past the installation space 20 without the projection optical system 36 having a significant object-image offset.

A numerical aperture of the illumination light 3 in the region of the intermediate focus 5a is NA=0.184.

The projection exposure installation 1 with the illumination optical system 35 and the projection optical system 36 has an intermediate focus-image offset D of 880 mm. The projection exposure installation 1 with the illumination optical system 35 and the projection optical system 36 has an illumination light beam-image offset E of 910 mm.

Figure 9:
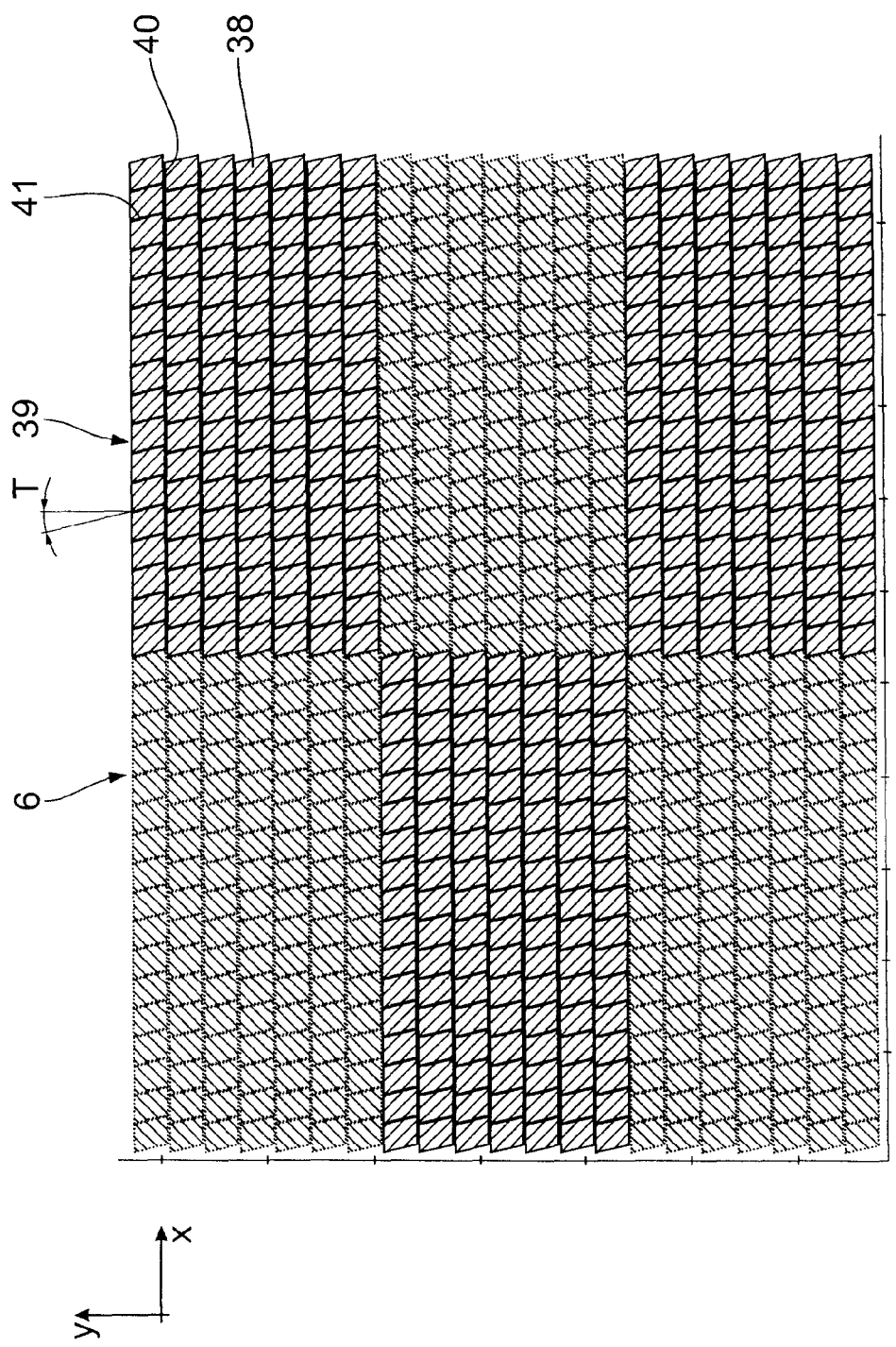
FIG. 9 shows in a view which has been enlarged again compared to FIG. 4, a plurality of transmission facet groups of a further configuration of a transmission facet mirror, which guide illumination light for the complete illumination of the object field, the transmission facet groups each being shown in a detail.

FIG. 9 shows an alternative arrangement from the arrangement according to FIG. 4 of transmission facets 38 and an alternative grouping of these transmission facets 38 to transmission facet groups 39. The transmission facet groups 39 are only shown portion-wise in FIG. 9 in the x-direction and have an x/y aspect ratio which corresponds to that of the transmission facet groups 22 according to FIG. 4. In contrast to the transmission facet groups 22, the transmission facet groups 39 are rectangular in design. An object field which is rectangular in design as an alternative to the object field 12 can be illuminated with each of these transmission facet groups 39. It is also possible to illuminate the arcuate object field 12 with the rectangular transmission facet groups 39, the mirror 34 then, for example, ensuring grazing incidence for a corresponding field shaping.

The covering of the transmission facet mirror 6 with the transmission facets 38 is reminiscent of covering a house wall with wood shingles. Each of the transmission facet groups 39 has seven lines arranged one above the other of transmission facets 38 lying next to one another. Interstices 40 between these lines extend continuously horizontally, in other words in the x-direction. Interstices 41 between transmission facets 38 adjacent within one of the lines extend at an angle T with respect to the y-direction, in other words with respect to the column direction of the arrangement of the transmission facets 38. In the configuration shown, the angle T is about 12°. Other intersice angles T are possible, for example intersice angles T of 5°, 8°, 19°, 15° or 20°.

The individual transmission facets 38 have an x/y aspect ratio which corresponds to the x/y aspect ratio of the transmission facet groups 39. The fact that this looks different in the view according to FIG. 9 is due to the fact that the transmission facets 38 in the x-direction are shown in a very compressed manner.

The ratio $B/d_{OIS}$ of an installation length B of the projection optical system 10, in other words the spacing between the object plane 9 and the image plane 18, and the object-image offset $d_{OIS}$, according to the configuration according to FIG. 1, is about 1.8. Other ratios, which are less than 20, can also be used, depending on the size of the installation space 20, for guiding the illumination light 3 past the installation space 20, for example a ratio B/$d_{OIS}$ of 15, of 12, of 10, of 8, of 6, of 4 or of 3. In smaller ratios B/$d_{OIS}$ are also possible.

An installation length B, in other words the spacing between the object plane 9 and the image plane 18, of the projection optical systems described in conjunction with FIGS. 1, 6 and 7, is 1800 mm.

Figure 10:
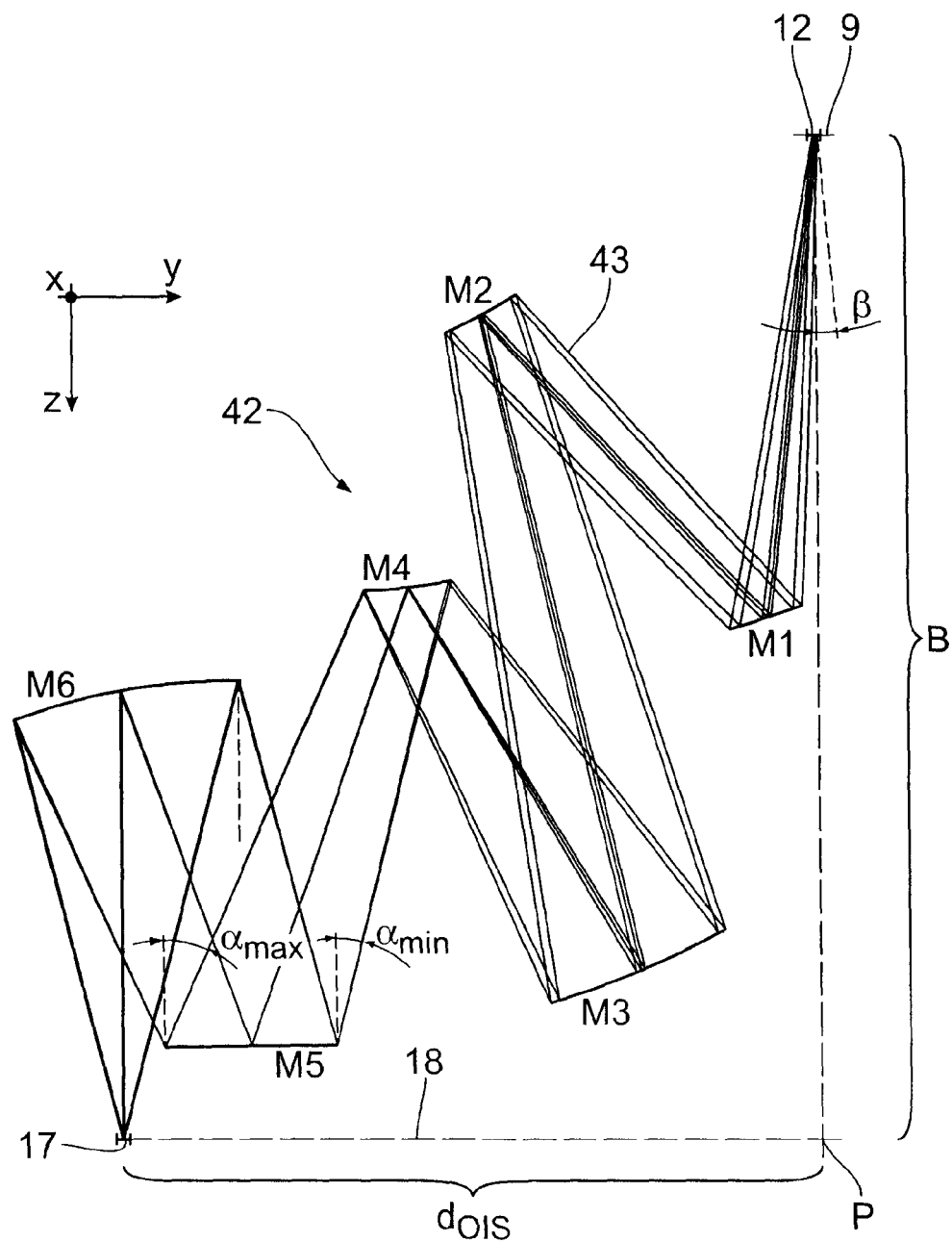
FIG. 10 shows a meridional section containing imaging beam paths by way of example through a configuration of a projection optical system for the projection exposure installations shown above.

FIG. 10 shows a first configuration of an optical design for a projection optical system 42, which can be used instead of the projection optical systems described schematically above in the projection exposure installation 1. The course of individual imaging beams 43 of the illumination light 3, which issue from two mutually spaced apart field points, is shown. Also shown as one of the imaging beams 43 is the main beam of the central field point, in other words the main beam of the field point, which lies precisely on the intersection point of the diagonals connecting the corners of the object field 12 or the image field 17.

In the projection optical system 42, the image plane 18 is the first field plane of the projection optical system 42 after the object plane 9. The projection optical system 42 in other words has no intermediate image plane.

The projection optical system 42 has a numerical aperture of 0.25 on the image side. An installation length B, in other words the spacing between the object plane 9 and the image plane 18 of the projection optical system 42, is 1585 mm.

In the case of configurations which are possible in principle but not shown, of projection optical systems, in which the object plane 9 is not arranged parallel to the image plane 18, the overall length B is defined as the spacing of a central object field point from the image plane. In a projection optical system, which is also possible but not shown, with an uneven mirror number, for example with seven or with nine mirrors, the installation length is defined as the maximum spacing between one of the mirrors and one of the field planes.

An object-image offset $d_{OIS}$ of the projection optical system 42 is 1114.5 mm. The object-image offset $d_{OIS}$ is defined here as the spacing between a perpendicular projection P of a central object field point onto the image plane 18 and the central image point.

The ratio between the installation length B and the object-image offset $d_{OIS}$ in the projection optical system according to FIG. 10 is therefore about 1.42.

The field size of the projection optical system 42 in the image plane 18 is 2 mm in the y-direction and 26 mm in the x-direction and, in the object plane 9, 8 mm in the y-direction and 108 mm in the x-direction.

The object field 12 and the image field 17 are rectangular. Basically, the fields may also be part ring-shaped with a corresponding xy aspect ratio, in other words can also be present as curved fields.

The y-dimension of the fields is also designated the slit height and the x-dimension as the slit width.

An angle of incidence β of the imaging beams 43 on the object field 12, in other words on the reflection mask or the reticle, is 6°. Other angles of incidence β are possible.

The projection optical system 42 has a total of six mirrors M1, M2, M3, M4, M5, M6 which are numbered, proceeding from the object field 12, in the order of impingement by the illumination light 3. The mirrors M3 and M6 are concave. The mirror M4 is convex. Only the reflection faces of the mirrors M1 to M6 are shown in FIG. 10 but not all the mirror bodies or associated holders.

The mirrors M1 to M6 are impinged upon by the illumination light 3, in each case with an angle of incidence spectrum. This angle of incidence spectrum is the difference between a smallest angle of incidence $\alpha_{min}$ and a greatest angle of incidence $\alpha_{max}$ on the respective mirror M1 to M6. This is shown in FIG. 10 using the example of the penultimate mirror M5, which has the absolutely greatest angle of incidence spectrum of the projection optical system 42.

The following Table reflects the angle of incidence spectrum $\alpha_{max}$-$\alpha_{min}$ for the mirrors M1 to M6:

| Mirror | $\alpha_{max} - \alpha_{min}$ |
|---|---|
| M1 | 4.4° |
| M2 | 5.5° |
| M3 | 2.3° |
| M4 | 2.2° |
| M5 | 10° |
| M6 | 9.6° |

In the meridional section shown in FIG. 10, the smallest angle of incidence $\alpha_{min}$ occurs on the mirror M5 at its right-hand edge and is about 14°. The largest angle of incidence $\alpha_{max}$ occurs in FIG. 10 at the left-hand edge of the mirror M5 and is about 24°. The mirror M5 thus has an angle of incidence spectrum of 10°. This angle of incidence spectrum is simultaneously the largest angle of incidence difference at one of the mirrors M1 to M6. The angles of incidence on the mirrors M1 to M6 of the projection optical system 42 therefore fluctuate practically exclusively in a range, in which the approximation of small angles (0°≤α≤7°) is very well fulfilled. The mirrors M1 to M6 are therefore in each case coated over their entire reflection face with a reflection coating with a uniform thickness.

The reflection coating is, in particular, a multi-layer coating, in other words a layer stack of alternating molybdenum and silicon layers, as is known for EUV reflection coatings. It is ensured because of the small maximum angle of incidence spectrum of only 10° that the reflection on all the mirrors M1 to M6 of the projection optical system 42 is approximately constant over the entire mirror face thereof. An undesired reflection course over the respective mirror face or an undesirably large apodisation therefore does not occur in the projection optical system 42. The apodisation is defined as the variation of the intensity distribution of the illumination light 3 over the pupil. If the maximum intensity of the illumination light 3 in a pupil plane of the projection optical system 7 is designated $I_{max}$ and the minimum intensity of the illumination light 3 over this pupil plane is designated $I_{min}$, the value $$A = (I_{max} - I_{min})/I_{max}$$

Is for example, a measure of the apodisation.

At least one of the mirrors M1 to M6 has a reflection face, which is configured as a freeform reflection face with a biconical basic shape and can be described by the following face formula:

$$z = \frac{cvx \cdot x^2 + cvy \cdot y^2}{1 + \sqrt{1 - cvx^2(ccx+1)x^2 - cvy^2(ccy+1)y^2}} + \sum_{i=0}^{n} \sum_{j=0}^{i} \alpha_{j,i-j} x^j y^{i-j}$$

x and y in this case designate the coordinates on the reflection face, proceeding from a coordinate origin, which is defined as the piercing point of a normal through the reflection face. This piercing point may theoretically also lie outside the reflection face used.

z designates the arrow height of the freeform reflection face. The coefficients cvx and cvy describe the curvatures of the freeform reflection face in the xz- and in the yz-section. The coefficients ccx and ccy are conical parameters.

The freeform face formula has a leading biconical term and a following xy-polynomial with coefficients $a_{ji}$.

The arrangement and shape of the optical faces of the mirrors M1 to M6 within the projection optical system 42 are specified by the following Tables.

Table 1, in the first column, defines selected services as numbers. In the second column, the spacing of the respective surface from the respective next surface in the z-direction is given. The third column of Table 1 gives a y-decentration of the local coordinate system of the respective face with respect to a global coordinate system.

The last column of Table 1 allows an allocation of the defined surfaces to the components of the projection optical system 42.

TABLE 1

| Surface | Spacing after the previous surface | y-decentration | |
|---|---|---|---|
| 0 | 0.000000 | 0 | Image plane |
| 1 | 708.322803 | 0 | |
| 2 | −617.533694 | −91.468948 | M6 |
| 3 | 583.375491 | −91.682056 | M5 |
| 4 | −593.218566 | −91.059467 | M4 |
| 5 | 648.730180 | −155.250886 | M3 |
| 6 | −403.572644 | −96.008370 | M2 |
| 7 | 674.571026 | −73.556295 | M1 |
| 8 | 0.000000 | −656.479198 | Object plane |

Table 2 represents the data on the respective freeform reflection faces of the mirrors M6 (surface 2), M5 (surface 3), M4 (surface 4), M3 (surface 5), M2 (surface 6) and M1 (surface 7). Coefficients not given equal zero. In addition there applies: RDX=1/cvx; RDY=1/cvy.

TABLE 2

| Freeform data | | |
|---|---|---|
| Surface | 2 | |
| RDY | −970.864728 | |
| RDX | −994.977890 | |
| CCY | 0.433521 | |
| CCX | 0.477907 | |
| j | i-j | $a_{j,\,i\text{-}j}$ |
| 0 | 1 | −1.160933E−03 |
| 2 | 0 | −2.807756E−05 |
| 0 | 2 | −2.400704E−05 |
| 2 | 1 | −2.727535E−10 |
| 0 | 3 | −1.561712E−09 |
| Surface | 3 | |
| RDY | −859.920276 | |
| RDX | −909.711920 | |
| CCY | 2.066084 | |
| CCX | 2.157360 | |
| j | i-j | $a_{j,\,i\text{-}j}$ |
| 0 | 1 | −6.956243E−03 |
| 2 | 0 | 4.069558E−04 |
| 0 | 2 | 4.110308E−04 |
| 2 | 1 | −1.135961E−08 |
| 0 | 3 | −3.068762E−08 |
| Surface | 4 | |
| RDY | 2123.400000 | |
| RDX | 1668.900000 | |
| CCY | 11.575729 | |
| CCX | 7.435682 | |
| j | i-j | $a_{j,\,i\text{-}j}$ |
| 0 | 1 | 1.393833E−01 |
| 2 | 0 | 3.570289E−04 |
| 0 | 2 | 4.726719E−04 |
| 2 | 1 | 4.922014E−08 |
| 0 | 3 | 1.301911E−09 |
| Surface | 5 | |
| RDY | 1292.100000 | |
| RDX | 1411.600000 | |
| CCY | −0.067691 | |
| CCX | 0.332429 | |
| j | i-j | $a_{j,\,i\text{-}j}$ |
| 0 | 1 | 2.827164E−03 |
| 2 | 0 | 3.218435E−05 |

TABLE 2-continued

| Freeform data | | |
|---|---|---|
| 0 | 2 | 6.355344E−07 |
| 2 | 1 | 3.212318E−09 |
| 0 | 3 | 3.463152E−09 |
| Surface | 6 | |
| RDY | −2615.500000 | |
| RDX | −11975.000000 | |
| CCY | 0.354474 | |
| CCX | 58.821858 | |
| j | i-j | $a_{j,\,i\text{-}j}$ |
| 0 | 1 | −1.510373E−01 |
| 2 | 0 | 2.929133E−04 |
| 0 | 2 | 3.971921E−04 |
| 2 | 1 | −2.211237E−08 |
| 0 | 3 | 2.084484E−08 |
| Surface | 7 | |
| RDY | 171.052222 | |
| RDX | 507.844993 | |
| CCY | −1.000256 | |
| CCX | −1.006263 | |
| j | i-j | $a_{j,\,i\text{-}j}$ |
| 0 | 1 | 1.224307E−02 |
| 2 | 0 | −7.916373E−04 |
| 0 | 2 | −2.757507E−03 |
| 2 | 1 | −3.313700E−08 |
| 0 | 3 | −7.040288E−09 |

Figure 11:
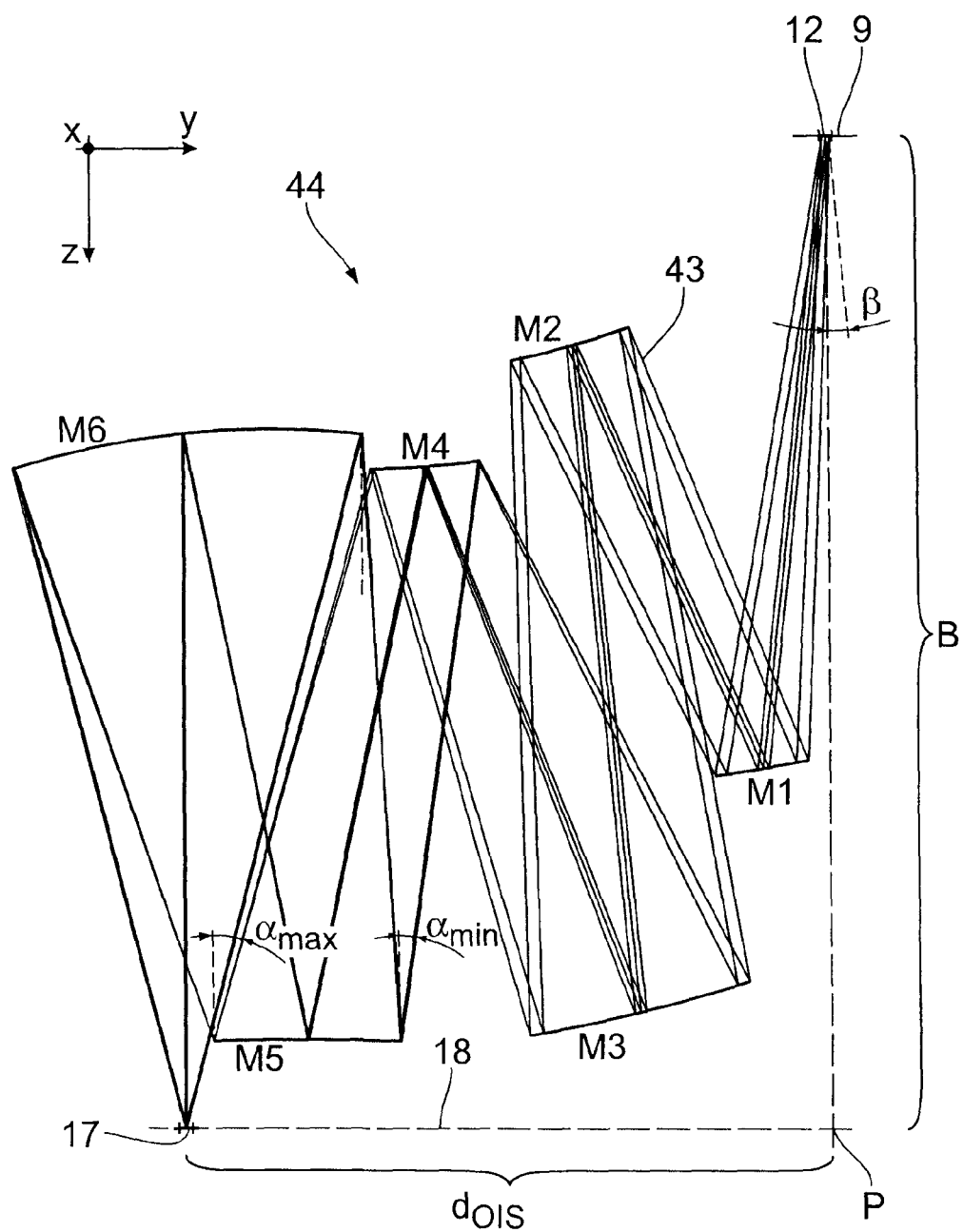
FIGS. 11 to 13 show further configurations of projection optical systems for the configurations of projection exposure installations shown above.

FIG. 11 shows a further configuration of a projection optical system 44, which can be used instead of the projection optical system 42 in the projection exposure installation 1. Components of the projection optical system 44, which correspond to those which have already been described above with reference to the projection optical system 42 have the same reference numerals and are not discussed again in detail.

The projection optical system 44 has a numerical aperture of 0.25 on the image side. The installation length B of the projection optical system 44 is 1000 mm. The object-image offset $d_{OIS}$ in the projection optical system 44 is 656.5 mm. The ratio $B/d_{OIS}$ is therefore about 1.52.

The maximum angle of incidence spectrum is also present in the projection optical system 44 at the mirror M5 and is 12° there. The minimum angle of incidence at the mirror M5 is present on the right-hand edge in FIG. 11 and is about 6°. The maximum angle of incidence on the mirror M5 in FIG. 11 is present at the left-hand edge and is about 18°. The image plane 18 is also the first field plane after the object plane 9 in the projection optical system 44.

At least one of the mirrors M1 to M6 is also configured as a biconical freeform reflection face in the projection optical system 44. The arrangement and shape of the optical faces of the mirrors M1 to M6 within the projection optical system 44 is specified by the following tables.

Table 3 defines, in the first column, selected surfaces as numbers. In the second column, the spacing of the respective surface from the respective next surface in the z-direction is given. The third column of Table 3 gives a y-decentration of the local coordinate system of the respective face with respect to a global coordinate system.

The last column of Table 3 allows an allocation of the defined surfaces to the components of the projection optical system 44.

TABLE 3

| Surface | Spacing after the previous surface | y-decentration | |
|---|---|---|---|
| 0 | 0.000000 | 0 | Image plane |
| 1 | 636.883689 | 0 | |
| 2 | −584.268871 | −127.232050 | M6 |
| 3 | 649.268844 | −127.625397 | M5 |
| 4 | −689.518581 | −127.310875 | M4 |
| 5 | 635.140406 | −214.759354 | M3 |
| 6 | −438.983578 | −160.525812 | M2 |
| 7 | 792.496449 | −161.853347 | M1 |
| 8 | 0.000000 | −978.074419 | Object plane |

Table 4 represents the data on the respective freeform reflection faces of the mirrors M6 (surface 2), M5 (surface 3), M4 (surface 4), M3 (surface 5), M2 (surface 6) and M1 (surface 7). Coefficients not given equal zero. In addition there applies: RDX=1/cvx; RDY=1/cvy.

TABLE 4

| Freeform data | | |
|---|---|---|
| Surface | 2 | |
| RDY | −1024.300000 | |
| RDX | −1051.200000 | |
| CCY | 0.715756 | |
| CCX | 0.739924 | |
| j | i-j | $a_{j,\,i\text{-}j}$ |
| 0 | 1 | −7.576779E−04 |
| 2 | 0 | −3.738732E−05 |
| 0 | 2 | −4.247383E−05 |
| 2 | 1 | 9.295774E−10 |
| 0 | 3 | −2.890724E−09 |
| 4 | 0 | −7.975116E−13 |
| 2 | 2 | −5.165327E−12 |
| 0 | 4 | 3.661841E−13 |
| 4 | 1 | −7.996231E−16 |
| 2 | 3 | 2.111768E−15 |
| 0 | 5 | −1.722248E−15 |
| 6 | 0 | −5.045304E−19 |
| 4 | 2 | 5.124801E−18 |
| 2 | 4 | 6.369116E−18 |
| 0 | 6 | −1.032383E−18 |
| Surface | 3 | |
| RDY | −1035.900000 | |
| RDX | −1101.300000 | |
| CCY | 2.617124 | |
| CCX | 2.951155 | |
| j | i-j | $a_{j,\,i\text{-}j}$ |
| 0 | 1 | −2.179019E−03 |
| 2 | 0 | 4.431389E−04 |
| 0 | 2 | 4.560760E−04 |
| 2 | 1 | −1.644268E−08 |
| 0 | 3 | −2.950490E−08 |
| 4 | 0 | 2.263165E−11 |
| 2 | 2 | 1.778578E−11 |
| 0 | 4 | 1.964554E−12 |
| 4 | 1 | 1.279827E−14 |
| 2 | 3 | 6.648394E−14 |
| 0 | 5 | −2.265488E−14 |
| 6 | 0 | 2.095952E−17 |
| 4 | 2 | 4.287989E−17 |
| 2 | 4 | −1.642439E−17 |
| 0 | 6 | −2.118969E−17 |
| Surface | 4 | |
| RDY | 1665.900000 | |
| RDX | 1372.000000 | |
| CCY | 9.138623 | |
| CCX | 1.926620 | |
| j | i-j | $a_{j,\,i\text{-}j}$ |
| 0 | 1 | 2.014437E−01 |
| 2 | 0 | 2.109164E−04 |
| 0 | 2 | 4.684147E−04 |
| 2 | 1 | 1.447739E−09 |
| 0 | 3 | 3.484838E−09 |

TABLE 4-continued

| Freeform data | | |
|---|---|---|
| 4 | 0 | −1.165581E−24 |
| 2 | 2 | 4.175896E−13 |
| 0 | 4 | 7.119405E−12 |
| 4 | 1 | 5.269322E−14 |
| 2 | 3 | −2.420761E−14 |
| 0 | 5 | −2.012170E−14 |
| 6 | 0 | −3.454027E−16 |
| 4 | 2 | 1.557629E−16 |
| 2 | 4 | −1.050420E−15 |
| 0 | 6 | −2.742748E−17 |
| Surface | 5 | |
| RDY | 1238.200000 | |
| RDX | 1414.200000 | |
| CCY | −0.000012 | |
| CCX | 0.119482 | |
| j | i-j | $a_{j,\,i\text{-}j}$ |
| 0 | 1 | 1.047982E−02 |
| 2 | 0 | 2.196150E−05 |
| 0 | 2 | 7.186632E−07 |
| 2 | 1 | 4.040466E−09 |
| 0 | 3 | 9.100125E−09 |
| 4 | 0 | 5.634656E−12 |
| 2 | 2 | −2.298266E−14 |
| 0 | 4 | −4.645176E−13 |
| 4 | 1 | 9.046464E−16 |
| 2 | 3 | −2.605868E−16 |
| 0 | 5 | −1.673891E−15 |
| 6 | 0 | −2.618503E−18 |
| 4 | 2 | 4.839689E−18 |
| 2 | 4 | −6.947211E−18 |
| 0 | 6 | −4.314040E−18 |
| Surface | 6 | |
| RDY | −3684.400000 | |
| RDX | −3506.300000 | |
| CCY | −0.001235 | |
| CCX | 0.415150 | |
| j | i-j | $a_{j,\,i\text{-}j}$ |
| 0 | 1 | −1.767860E−01 |
| 2 | 0 | 5.073838E−04 |
| 0 | 2 | 5.272916E−04 |
| 2 | 1 | −3.957421E−08 |
| 0 | 3 | 8.058238E−09 |
| 4 | 0 | 7.959552E−25 |
| 2 | 2 | −7.112502E−13 |
| 0 | 4 | 6.827653E−13 |
| 4 | 1 | −2.253930E−13 |
| 2 | 3 | 1.303253E−13 |
| 0 | 5 | 1.567942E−15 |
| 6 | 0 | −2.326019E−16 |
| 4 | 2 | −2.314170E−16 |
| 2 | 4 | 1.309455E−16 |
| 0 | 6 | −5.879379E−18 |
| Surface | 7 | |
| RDY | 167.705178 | |
| RDX | 408.126726 | |
| CCY | −1.001961 | |
| CCX | −0.994641 | |
| j | i-j | $a_{j,\,i\text{-}j}$ |
| 0 | 1 | −2.378224E−04 |
| 2 | 0 | −1.003186E−03 |
| 0 | 2 | −2.870643E−03 |
| 2 | 1 | −3.511331E−09 |
| 0 | 3 | −1.211650E−07 |
| 4 | 0 | −7.010621E−11 |
| 2 | 2 | −5.812898E−12 |
| 0 | 4 | −4.637999E−13 |
| 4 | 1 | −1.913197E−13 |
| 2 | 3 | 6.243649E−16 |
| 0 | 5 | 4.280774E−16 |
| 6 | 0 | −5.399656E−17 |
| 4 | 2 | −1.237113E−16 |
| 2 | 4 | 1.580174E−19 |
| 0 | 6 | 6.222451E−19 |

Figure 12:
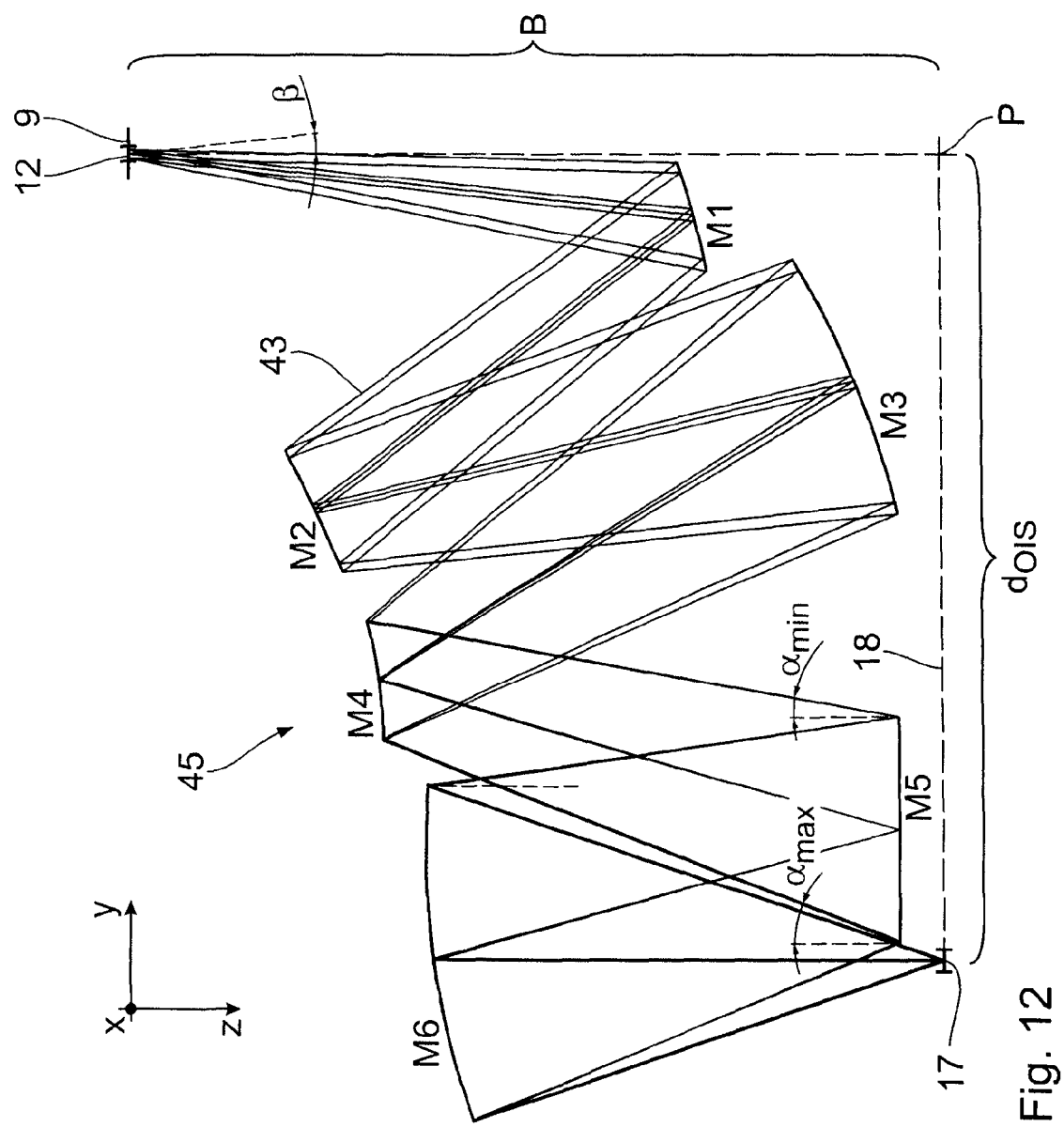

FIG. 12 shows a further configuration of a projection optical system 45, which can be used instead of the projection optical system 42 in the projection exposure installation 1. Components of the projection optical system 45, which correspond to those which have already been described above with reference to the projection optical system 42 have the same reference numerals and will not be discussed again in detail.

The projection optical system 45 has a numerical aperture of 0.32 on the image side. The installation length B of the projection optical system 45 is 1000 mm. The object-image offset $d_{OIS}$ in the projection optical system 45 is 978 mm. The ratio $B/d_{OIS}$ is therefore about 1.02.

The maximum angle of incidence spectrum is also present in the projection optical system 45 at the mirror M5 and is 13° there. The minimum angle of incidence at the mirror M5 is present at the right-hand edge in FIG. 12 and is about 9°. The maximum angle of incidence on the mirror M5 is present in FIG. 12 on the left-hand edge and is about 22°. The image plane 18 is also the first field plane after the object plane 9 in the projection optical system 45.

At least one of the mirrors M1 to M6 is also configured in the projection optical system 45 as a biconical freeform reflection face.

The arrangement and shape of the optical faces of the mirrors M1 to M6 within the projection optical system 45 is specified by the following Tables.

Table 5, in the first column, defines selected surfaces as numbers. In the second column, the spacing of the respective surface from the respective next surface in the z-direction is given. The third column of Table 5 gives a y-decentration of the local coordinate system of the respective face with respect to a global coordinate system.

The last column of Table 5 allows an allocation of the defined surfaces to the components of the projection optical system 45.

TABLE 5

| Surface | Spacing after the previous surface | y-decentration | |
|---|---|---|---|
| 0 | 0.000000 | 0.000000 | Image plane |
| 1 | 726.023335 | 0.000000 | |
| 2 | −577.595015 | −192.238869 | M6 |
| 3 | 745.417411 | −192.777551 | M5 |
| 4 | −738.103985 | −192.462469 | M4 |
| 5 | 994.730526 | −243.767917 | M3 |
| 6 | −450.919688 | −164.949143 | M2 |
| 7 | 885.694809 | −165.918838 | M1 |
| 8 | 0.000000 | −1114.493643 | Object plane |

Table 6 represents the data on the respective freeform reflection faces of the mirrors M6 (surface 2), M5 (surface 3), M4 (surface 4), M3 (surface 5), M2 (surface 6) and M1 (surface 7). Coefficients not given equal zero. In addition there applies: RDX=1/cvx; RDY=1/cvy.

TABLE 6

| Freeform data | | |
|---|---|---|
| Surface | 2 | |
| RDY | −1172.300000 | |
| RDX | −1295.000000 | |
| CCY | 0.787469 | |
| CCX | 1.053600 | |
| j | i-j | $a_{j,\,i-j}$ |
| 0 | 1 | −7.219074E−04 |
| 2 | 0 | −3.578974E−05 |
| 0 | 2 | −2.128273E−05 |
| 2 | 1 | 7.097815E−10 |
| 0 | 3 | −1.618913E−09 |
| 4 | 0 | −2.252005E−12 |
| 2 | 2 | −3.895991E−12 |
| 0 | 4 | 2.750606E−13 |
| 4 | 1 | −4.464498E−15 |

TABLE 6-continued

| Freeform data | | |
|---|---|---|
| 2 | 3 | −4.637860E−16 |
| 0 | 5 | −6.920120E−16 |
| 6 | 0 | −3.637297E−18 |
| 4 | 2 | 2.537830E−18 |
| 2 | 4 | 1.002850E−17 |
| 0 | 6 | −3.044197E−18 |
| Surface | 3 | |
| RDY | −1236.400000 | |
| RDX | −1536.200000 | |
| CCY | 2.551177 | |
| CCX | 4.047183 | |
| j | i-j | $a_{j,\,i-j}$ |
| 0 | 1 | −6.558677E−03 |
| 2 | 0 | 3.540129E−04 |
| 0 | 2 | 4.133618E−04 |
| 2 | 1 | −1.904320E−08 |
| 0 | 3 | −3.576692E−08 |
| 4 | 0 | 1.496417E−12 |
| 2 | 2 | 1.864663E−11 |
| 0 | 4 | 3.000005E−12 |
| 4 | 1 | −7.105811E−15 |
| 2 | 3 | 5.293727E−14 |
| 0 | 5 | −1.509974E−14 |
| 6 | 0 | 2.907360E−18 |
| 4 | 2 | 5.694619E−17 |
| 2 | 4 | 8.177232E−17 |
| 0 | 6 | 4.847943E−18 |
| Surface | 4 | |
| RDY | 2267.500000 | |
| RDX | 1709.200000 | |
| CCY | 13.716154 | |
| CCX | 2.188445 | |
| j | i-j | $a_{j,\,i-j}$ |
| 0 | 1 | 2.536301E−01 |
| 2 | 0 | 1.786226E−04 |
| 0 | 2 | 4.303983E−04 |
| 2 | 1 | −5.494928E−10 |
| 0 | 3 | 4.116436E−09 |
| 4 | 0 | −2.775915E−11 |
| 2 | 2 | 3.269596E−11 |
| 0 | 4 | 3.121929E−12 |
| 4 | 1 | 2.286620E−14 |
| 2 | 3 | 1.431437E−14 |
| 0 | 5 | −8.016660E−15 |
| 6 | 0 | −8.966865E−17 |
| 4 | 2 | 3.631639E−16 |
| 2 | 4 | −3.150250E−16 |
| 0 | 6 | −7.235944E−18 |
| Surface | 5 | |
| RDY | 1453.100000 | |
| RDX | 1691.600000 | |
| CCY | 0.004158 | |
| CCX | 0.130787 | |
| j | i-j | $a_{j,\,i-j}$ |
| 0 | 1 | 1.413720E−02 |
| 2 | 0 | 1.853431E−05 |
| 0 | 2 | 8.632041E−07 |
| 2 | 1 | 2.471907E−09 |
| 0 | 3 | 1.031600E−08 |
| 4 | 0 | 1.594814E−12 |
| 2 | 2 | 1.271047E−13 |
| 0 | 4 | −8.477699E−14 |
| 4 | 1 | 1.841514E−15 |
| 2 | 3 | 1.063273E−15 |
| 0 | 5 | −3.890516E−16 |
| 6 | 0 | −7.937130E−19 |
| 4 | 2 | 4.923627E−18 |
| 2 | 4 | −3.489821E−18 |
| 0 | 6 | −3.625541E−18 |
| Surface | 6 | |
| RDY | −3061.000000 | |
| RDX | −3961.700000 | |
| CCY | 0.069638 | |
| CCX | 0.416068 | |
| j | i-j | $a_{j,\,i-j}$ |
| 0 | 1 | −1.950186E−01 |
| 2 | 0 | 4.908498E−04 |
| 0 | 2 | 5.948960E−04 |

TABLE 6-continued

Freeform data

| | | |
|---|---|---|
| 2 | 1 | −2.711540E−08 |
| 0 | 3 | 1.073427E−08 |
| 4 | 0 | −3.053221E−12 |
| 2 | 2 | −5.601149E−12 |
| 0 | 4 | 4.072326E−13 |
| 4 | 1 | −3.675214E−13 |
| 2 | 3 | 3.165916E−14 |
| 0 | 5 | −1.649353E−15 |
| 6 | 0 | −8.908751E−17 |
| 4 | 2 | −2.427088E−16 |
| 2 | 4 | 2.643106E−16 |
| 0 | 6 | −7.400900E−18 |

| Surface | 7 | |
|---|---|---|
| RDY | 210.148013 | |
| RDX | 383.382688 | |
| CCY | −1.001702 | |
| CCX | −0.999069 | |

| j | i-j | $a_{j,\ i-j}$ |
|---|---|---|
| 0 | 1 | −2.506963E−04 |
| 2 | 0 | −1.093695E−03 |
| 0 | 2 | −2.285463E−03 |
| 2 | 1 | −7.246135E−09 |
| 0 | 3 | −1.030905E−07 |
| 4 | 0 | −7.535621E−11 |
| 2 | 2 | −4.600461E−12 |
| 0 | 4 | −9.217052E−14 |
| 4 | 1 | −2.057821E−13 |
| 2 | 3 | 2.433632E−16 |
| 0 | 5 | 1.627316E−16 |
| 6 | 0 | −1.969282E−17 |
| 4 | 2 | −1.033559E−16 |
| 2 | 4 | 2.086873E−17 |
| 0 | 6 | 1.058816E−18 |

Figure 13:
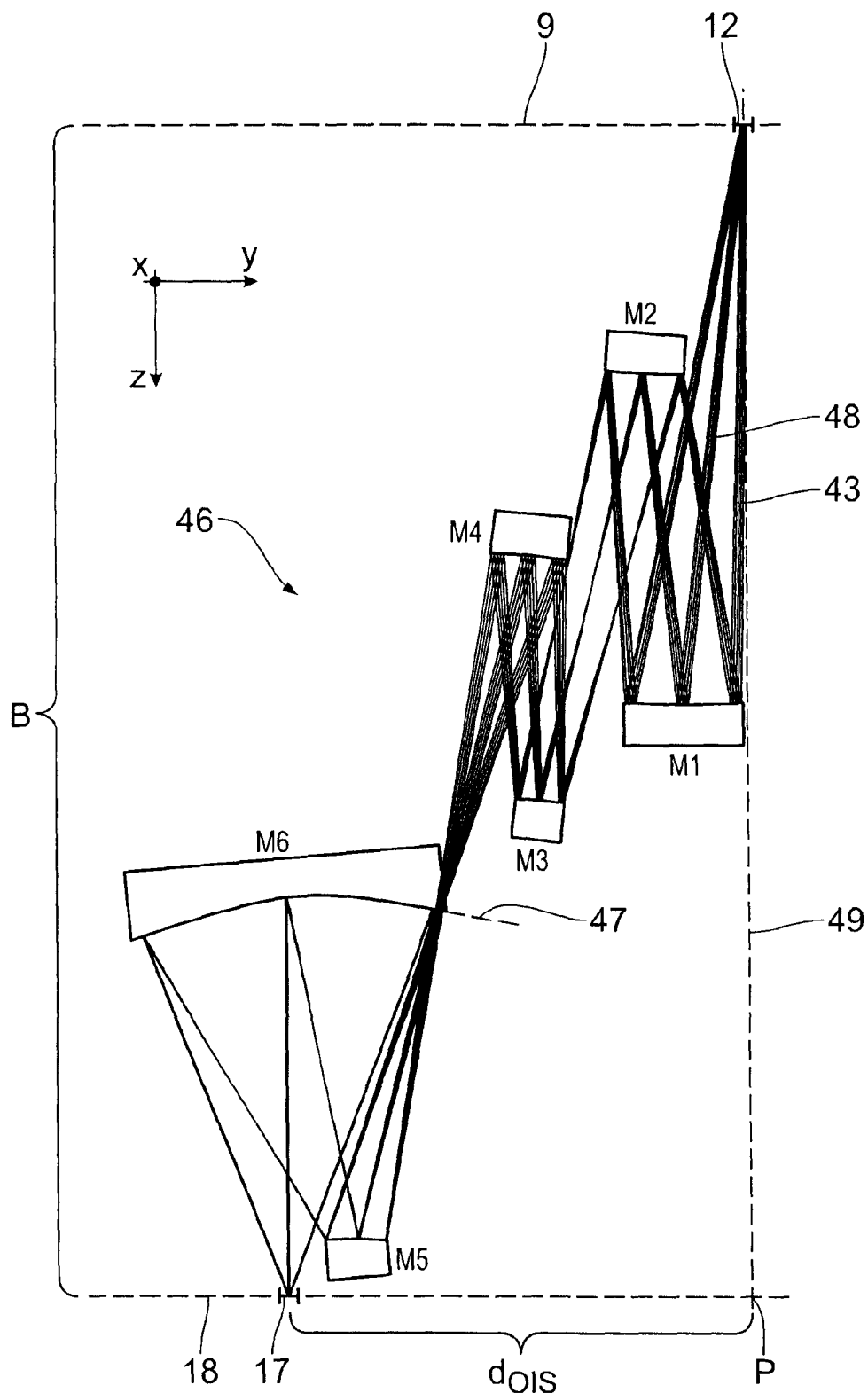

FIG. 13 shows a further configuration of a projection optical system 46, which can be used instead of the projection optical system 42 in the projection exposure installation 1. Components of the projection optical system 46, which correspond to those which have already been described above with reference to the projection optical system 42 have the same reference numerals and will not be discussed again in detail.

The projection optical system 46 has a numerical aperture of 0.35 on the image side. The installation length B of the projection optical system 46 is 1500 mm. The object-image offset $d_{OIS}$ is 580 mm in the projection optical system 46. The ratio B/$d_{OIS}$ is therefore about 2.59.

A minimum angle of incidence of 0.15° and a maximum angle of incidence of 23.72° is present on the mirror M5 of the projection optical system 46. The angle of incidence spectrum on the mirror M5 is therefore 23.58° and is the largest angle of incidence spectrum on one of the mirrors of the projection optical system 46.

The projection optical system 46 has an intermediate image plane 47 between the mirrors M4 and M5. This is present approximately where the imaging beams 43 are guided past the mirror M6.

The freeform reflection faces of the mirrors M1 to M6 of the projection optical system 46 can be described mathematically by the following equation:

$$Z = \frac{cr^2}{1 + \sqrt{1-(1+k)c^2r^2}} + \sum_{j=1}^{66} C_j X^m Y^n$$

wherein:

$$j = \frac{(m+n)^2 + m + 3n}{2} + 1$$

Z is the arrow height of the freeform face at the point x, y ($x^2+y^2=r$).

c is a constant, which corresponds to the vertex curvature of a corresponding asphere. k corresponds to a conical constant of a corresponding asphere. $C_j$ are the coefficients of the monomials $X^m Y^n$. Typically, the values of c, k and $C_j$ are determined on the basis of the desired optical properties of the mirror within the projection optical system 46. The order of the monomial m+n, can be varied as desired. A monomial of a higher order can lead to a design of the projection optical system with better image error correction, but is more complex to calculate. m+n may adopt values between 3 and more than 20.

Freeform faces may also be described mathematically by zernike polynomials, which are described, for example, in the manual of the optical design program CODE V®. Alternatively, freeform faces may be described with the aid of two-dimensional spline surfaces. Examples of this are bezier curves or non-uniform rational basis splines (NURBS). Two-dimensional spline surfaces may, for example, be described by a network of points in an xy-plane and associated z-values or by these points and gradients pertaining to them. Depending on the respective type of spline surface, the complete surface is obtained by interpolation between the network points using, for example, polynomials or functions, which have specific properties with regard to their continuity and differentiability. Examples of this are analytical functions.

The optical design data of the reflection faces of the mirrors M1 to M6 of the projection optical system 46 can be inferred from the following tables. The first of these tables gives, with respect to the optical faces of the optical components and the aperture stop, the respective reciprocal value of the vertex curvature (radius) and a spacing value (thickness), which corresponds to the z-spacing of adjacent elements in the beam path, proceeding from the object plane. The second table gives the coefficients $C_j$ of the monomials $X^m Y^n$ in the freeform face equation given above for the mirrors M1 to M6. Nradius here is a standardisation factor. According to the second table, the amount is also given in mm, along which the respective mirror, proceeding from a mirror reference design, was decentred (Y-decentre) and rotated (X-rotation). This corresponds to the parallel displacement and the tilting in the above-described freeform face design method. The displacement takes place here in the y-direction and the tilting is about the x-axis. The angle of rotation is given here in degrees.

| Surface | Radius | Spacing | Operating mode |
|---|---|---|---|
| Object plane | INFINITE | 727.645 | |
| Mirror 1 | −1521.368 | −420.551 | REFL |
| Mirror 2 | 4501.739 | 540.503 | REFL |
| Mirror 3 | 501.375 | −313.416 | REFL |
| Mirror 4 | 629.382 | 868.085 | REFL |
| Mirror 5 | 394.891 | −430.827 | REFL |
| Mirror 6 | 527.648 | 501.480 | REFL |
| Image plane | INFINITE | 0.000 | |

| Coefficient | M1 | M2 | M3 | M4 | M5 | M6 |
|---|---|---|---|---|---|---|
| K | −6.934683E+00 | −1.133415E+02 | −4.491203E+00 | 2.864941E−01 | 6.830961E+00 | 8.266681E−02 |
| Y | 0.000000E+00 | 0.000000E+00 | 0.000000E+00 | 0.000000E+00 | 0.000000E+00 | 0.000000E+00 |
| X2 | −1.784786E−04 | −1.625398E−04 | −4.091759E−04 | −1.283213E−05 | 1.852188E−04 | 1.527974E−06 |
| Y2 | −1.924874E−04 | −2.007476E−04 | −4.089273E−04 | −3.385713E−05 | 1.462618E−04 | 1.999354E−06 |
| X2Y | 7.567253E−08 | 3.033726E−07 | 4.563127E−07 | 3.550829E−08 | 2.779793E−07 | 6.063643E−10 |
| Y3 | 4.318244E−08 | 4.548440E−09 | −4.162578E−08 | −2.113434E−08 | 6.705950E−07 | 5.861708E−09 |
| X4 | −4.430972E−10 | −1.014203E−09 | 4.055457E−09 | −6.220378E−11 | −8.891669E−10 | −1.395997E−11 |
| X2Y2 | −8.520546E−10 | −6.881264E−10 | 8.939911E−09 | −1.392199E−10 | 5.141975E−09 | −1.167067E−11 |
| Y4 | −4.543477E−10 | 9.382921E−10 | 5.474325E−09 | −6.995794E−11 | 5.400196E−10 | 3.206239E−12 |
| X4Y | −2.099305E−14 | −4.394241E−13 | −5.095787E−12 | −1.116149E−14 | −3.574353E−13 | 5.504390E−15 |
| X2Y3 | −9.594625E−14 | −5.563377E−12 | −2.467721E−12 | 1.007430E−14 | 1.351005E−11 | 1.988648E−14 |
| Y5 | −6.552756E−13 | −1.586808E−11 | 3.433129E−11 | 1.283373E−12 | 5.833169E−11 | 8.273816E−15 |
| X6 | −5.518407E−17 | −4.175604E−15 | −2.733992E−14 | −9.578075E−17 | −7.907746E−14 | −2.844119E−17 |
| X4Y2 | 1.982470E−16 | 5.202976E−15 | −3.722675E−14 | 1.225726E−16 | 2.278266E−14 | −2.154623E−17 |
| X2Y4 | 3.530434E−16 | 2.469563E−14 | −2.047537E−13 | −1.207944E−15 | 2.530016E−13 | 2.350448E−18 |
| Y6 | 1.142642E−15 | 2.708016E−14 | −7.131019E−34 | 1.880641E−14 | 1.622798E−13 | −9.962638E−18 |
| X6Y | −6.790512E−20 | −1.328271E−17 | −2.926272E−16 | −2.248097E−19 | −4.457988E−16 | 8.532237E−21 |
| X4Y3 | −6.322471E−19 | 3.908456E−17 | −2.737455E−16 | −7.629602E−20 | 1.416184E−15 | 3.243375E−20 |
| X2Y5 | −1.195858E−17 | −5.908420E−17 | 6.146576E−15 | 1.102606E−16 | 3.414825E−15 | −2.740056E−21 |
| Y7 | 2.350101E−17 | −1.477424E−15 | 5.232866E−14 | 1.218965E−15 | 1.819850E−15 | −1.903739E−19 |
| X8 | −6.917298E−22 | 8.248359E−20 | 6.770710E−19 | 9.667078E−22 | −3.953231E−39 | −4.407667E−23 |
| X6Y2 | −4.633739E−22 | 1.268409E−19 | −1.035701E−18 | −6.006155E−20 | 2.725218E−38 | −6.933821E−23 |
| X4Y4 | −1.497254E−20 | −1.719209E−18 | −3.217683E−18 | −1.742201E−20 | −1.679944E−39 | 4.964397E−23 |
| X2Y6 | −3.969441E−20 | −3.497307E−18 | 4.228227E−17 | −2.566234E−18 | 4.611895E−18 | 1.663632E−22 |
| Y8 | 6.708554E−20 | 1.187270E−18 | 2.685040E−38 | −1.611964E−39 | 4.730942E−18 | 6.011162E−23 |
| X8Y | −4.466562E−24 | 3.597751E−23 | 2.879249E−20 | −1.588496E−23 | −5.662885E−20 | 5.805689E−26 |
| X6Y3 | 2.874487E−23 | 1.003878E−20 | 6.793162E−20 | 3.438183E−23 | −1.071225E−20 | −1.310631E−25 |
| X4Y5 | 2.249612E−23 | 1.390470E−20 | 1.950655E−19 | 1.008316E−21 | −6.062162E−20 | −3.380438E−25 |
| X2Y7 | 5.258895E−22 | 2.194560E−20 | −2.724912E−18 | −3.405763E−20 | −1.780372E−19 | 1.649113E−25 |
| Y9 | −4.497858E−21 | 2.311634E−19 | −2.656603E−17 | −3.124398E−19 | −1.417439E−19 | 2.296226E−24 |
| X10 | 0.000000E+00 | −6.351950E−24 | −8.560053E−23 | −4.339912E−26 | −8.430614E−22 | −3.388610E−28 |
| X8Y2 | 0.000000E+00 | 4.523937E−24 | 9.792140E−22 | 2.952972E−24 | 9.614763E−23 | 1.083831E−27 |
| X6Y4 | 0.000000E+00 | −9.774541E−23 | −2.428620E−21 | −5.303412E−24 | −1.020095E−22 | 3.199302E−27 |
| X4Y6 | 0.000000E+00 | 4.704150E−23 | 1.195308E−42 | 2.279968E−23 | −6.658041E−23 | 1.968405E−27 |
| X2Y8 | 0.000000E+00 | 1.270549E−22 | 1.329832E−41 | 8.858543E−22 | 5.185397E−22 | 3.257732E−28 |
| Y10 | 0.000000E+00 | −1.244299E−21 | −8.254524E−44 | −6.003123E−22 | 5.204197E−23 | 1.473250E−27 |
| Nradius | 1.000000E+00 | 1.000000E+00 | 1.000000E+00 | 1.000000E+00 | 1.000000E+00 | 1.000000E+00 |

| Coefficient | M1 | M2 | M3 | M4 | M5 | M6 | Image |
|---|---|---|---|---|---|---|---|
| Y-decentration | 37.685 | −15.713 | −139.004 | −151.477 | −395.184 | −440.921 | 0.000 |
| X-rotation | 0.326 | −3.648 | −5.539 | −5.647 | 4.878 | 5.248 | 0.000 |

In FIG. 13, the reference numeral 48 designates a main beam, which belongs to a central object field point. A normal onto the object plane 9 is designated 49 in FIG. 13 and runs through the central object field point. The main beam 48 and the normal 49 thus intersect in the object plane 9. The spacing of the main beam 48 from the normal 49 increases monotonically along the further beam path of the main beam 48 between the object plane 9 and the image plane 18. When the main beam 48 passes through the image plane 18, in other word in the central image field point, this spacing is identical to the object-image offset $d_{OIS}$. The monotonic increase in the spacing of the main beam 48 from the normal 49 in the beam path between the object plane 9 and the image plane 18 means that this spacing along the course of the beam path does not become smaller anywhere. In the projection optical system 46, this spacing becomes constantly greater until the main beam 48 impinges upon the last mirror M6. This spacing remains constant between the point of impingement of the main beam 48 on the mirror M6 and the image plane 18.

To produce a microstructured component, in particular a highly integrated semiconductor component, for example a memory chip, with the aid of the projection exposure installation 1, the reticle 8 and the wafer 19 are firstly provided. A structure on the reticle 8 is then projected by the projection optical system of the projection exposure installation 1 onto a light-sensitive layer on the wafer 19. By developing the light-sensitive layer, a microstructure is then produced on the wafer 19 and, from this, the microstructured or nanostructured component is produced.

The invention claimed is:

1. An illumination optical system configured to illuminate an object field, the illumination optical system comprising:
   a transmission optical system configured to guide illumination light;
   an illumination facet mirror downstream of the transmission optical system along a path of the illumination light through the illumination optical system, the illumination facet mirror comprising a plurality of illumination facets configured to produce an illumination of the object field via:
   an edge shape of the illumination facet mirror, the edge shape being capable of being illuminated with the illumination light; and
   individual tilting angles of the illumination facets,
   wherein:
   the transmission optical system and the illumination facet mirror are arranged so that the object field is telecentrically illuminated; and
   the illumination optical system is a microlithography illumination optical system.

2. The illumination optical system of claim 1, comprising a collector, wherein the illumination optical system comprises at most three reflective components between the collector and the object field.

3. The illumination optical system of claim 2, wherein:
the transmission optical system comprises a transmission facet mirror upstream of the illumination facet mirror along the path of the illumination light through the illumination optical system;
the transmission facet mirror comprises a plurality of transmission facets configured so that the illumination facet mirror is illuminated with an edge shape adapted to the shape of the object field; and
each transmission facets is allocated to a corresponding illumination facet.

4. The illumination optical system of claim 1, wherein:
the transmission optical system comprises a transmission facet mirror upstream of the illumination facet mirror along the path of the illumination light through the illumination optical system;
the transmission facet mirror comprises a plurality of transmission facets configured so that the illumination facet mirror is illuminated with an edge shape adapted to the shape of the object field; and
each transmission facets is allocated to a corresponding illumination facet.

5. The illumination optical system of claim 4, wherein the transmission facets are grouped in a plurality of transmission facet groups, and each transmission facet group guides a portion of the illumination light to the object field so that the object field is completely illuminate.

6. The illumination optical system of claim 5, wherein the transmission facet groups define a group edge shape which is geometrically similar to the edge shape of the object field.

7. The illumination optical system of claim 5, wherein:
the transmission facets defining a transmission facet group are arranged in a plurality of columns; and
in each of the columns, a plurality of transmission facets are arranged consecutively in a column direction.

8. The illumination optical system of claim 7, wherein adjacent columns comprise transmission facets which are offset with respect to each other along the column direction.

9. The illumination optical system of claim 7, wherein the transmission facets are separated from each other by interstices which extend at a non-zero angle with respect to the column direction.

10. The illumination optical system of claim 7, wherein the illumination facet mirror has a through-opening through which the illumination light passes along the path of the illumination light between the light source and the transmission facet mirror.

11. The illumination optical system of claim 4, wherein the illumination facet mirror has a through-opening through which the illumination light passes along the path of the illumination light between the light source and the transmission facet mirror.

12. An optical system, comprising:
an illumination optical system according to claim 1; and
a projection optical system configured to image the object field into an image field.

13. The optical system of claim 12, wherein the individual tilting angles of the illumination facets are configured so that:
when the illumination facets have a first set of tilting angles, the illumination facets produce an illumination of the object field; and
when the illumination facets have a second set of tilting angles, the illumination facets do not produce an illumination of the object field, the second set of tilting angles being different from the first set of tilting angles.

14. A method, comprising:
providing an optical system comprising:
an illumination optical system according to claim 1; and
a projection optical system configured to image the object field into an image field; and
using the optical system to project at least a portion of a reticle onto a wafer having a light-sensitive coating to provide an exposed light-sensitive coating.

15. The method of claim 14, further comprising developing the exposed light-sensitive coating.

16. The method of claim 15, wherein the method provides a microstructured component or a nanostructured component.

17. The method of claim 14, wherein the individual tilting angles of the illumination facets are configured so that:
when the illumination facets have a first set of tilting angles, the illumination facets produce an illumination of the object field; and
when the illumination facets have a second set of tilting angles, the illumination facets do not produce an illumination of the object field, the second set of tilting angles being different from the first set of tilting angles.

18. The illumination optical system of claim 1, wherein the individual tilting angles of the illumination facets are configured so that:
when the illumination facets have a first set of tilting angles, the illumination facets do not produce an illumination of the object field; and
when the illumination facets have a second set of tilting angles, the illumination facets produce an illumination of the object field, the second set of tilting angles being different from the first set of tilting angles.

19. An optical system, comprising:
a microlithography illumination optical system configured to illuminate an object field, the microlithography illumination optical system comprising:
a transmission optical system configured to guide illumination light; and
an illumination facet mirror downstream of the transmission optical system along a path of the illumination light through the microlithography illumination optical system, the illumination facet mirror comprising a plurality of illumination facets configured to produce an illumination of the object field via:
an edge shape of the illumination facet mirror, the edge shape being capable of being illuminated with the illumination light; and
tilting angles of the illumination facets configured so that:
when the illumination facets have a first set of tilting angles, the illumination facets produce a first intensity distribution of the illumination light over the object field; and
when the illumination facets have a second set of tilting angles which is different from the first set of tilting angles, the illumination facets produce a second intensity distribution of the illumination light over the object field which is different from the first intensity distribution of the illumination light over the object field; and
a projection optical system configured to image the object field into an image field,
wherein:
an entry pupil of the projection optical system is arranged between the illumination facet mirror and the object field or after the object field;

the transmission optical system and the illumination facet mirror are configured so that illumination of the object field is adapted to the entry pupil of the projection optical system.

20. The optical system of claim 19, wherein a ratio of a spacing of the entry pupil from the object field to a spacing of the object field from the illumination facet mirror is less than 0.9.

21. A method, comprising:
providing the optical system of claim 19; and
using the optical system to project at least a portion of a reticle onto a wafer having a light-sensitive coating to provide an exposed light-sensitive coating.

22. The method of claim 21, further comprising developing the exposed light-sensitive coating.

23. The method of claim 22, wherein the method provides a microstructured component or a nanostructured component.

24. The optical system of claim 19, wherein the illumination facets are configured to be individually tilted so that they have individual tilt angles.

* * * * *

UNITED STATES PATENT AND TRADEMARK OFFICE
CERTIFICATE OF CORRECTION

PATENT NO. : 9,164,394 B2  
APPLICATION NO. : 13/216677  
DATED : October 20, 2015  
INVENTOR(S) : Endres Page 1 of 1

It is certified that error appears in the above-identified patent and that said Letters Patent is hereby corrected as shown below:

On the title page

Page 2, Col. 2, item [56] line 1 under "FOREIGN PATENT DOCUMENTS", delete "10 2006 043 2" and insert -- 10 2006 043 251 A1 --.

In the specification

Col. 12, line 54, delete both occurrences of "intersice" and replace each occurrence with -- interstice --.

Col. 21, line 65, delete "$Z = \dfrac{cr^2}{1+\sqrt{1-(1+k)c^2 r^2}} + \sum_{j=1}^{66} C_j X^m Y^n$"

and insert -- $Z = \dfrac{cr^2}{1+\sqrt{1-(1+k)c^2 r^2}} + \sum_{j=2}^{66} C_j X^m Y^n$ --.

Col. 22, line 20, delete "calculate." and insert -- calculate --.

Signed and Sealed this  
Nineteenth Day of April, 2016

Michelle K. Lee  
*Director of the United States Patent and Trademark Office*